(12) United States Patent
Saruwatari et al.

(10) Patent No.: US 10,026,768 B2
(45) Date of Patent: Jul. 17, 2018

(54) DETECTOR, DETECTOR WITH LOCK-IN AMPLIFIER, SUBSTRATE, AND METHOD FOR MANUFACTURING A DETECTOR

(71) Applicant: NIKON CORPORATION, Tokyo (JP)

(72) Inventors: Osamu Saruwatari, Yokohama (JP); Shigeru Aoki, Yokohama (JP); Kazuya Okamoto, Yokohama (JP); Isao Sugaya, Kawasaki (JP); Masashi Okada, Sagamihara (JP); Hiroshi Ohki, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 126 days.

(21) Appl. No.: 15/270,367

(22) Filed: Sep. 20, 2016

(65) Prior Publication Data

US 2017/0069677 A1 Mar. 9, 2017

Related U.S. Application Data

(63) Continuation of application No. PCT/JP2015/060264, filed on Mar. 31, 2015.

(30) Foreign Application Priority Data

Mar. 31, 2014 (JP) .................................. 2014-074063

(51) Int. Cl.
*H01L 27/146* (2006.01)
*H01L 25/065* (2006.01)
(Continued)

(52) U.S. Cl.
CPC ...... *H01L 27/14634* (2013.01); *G01S 7/4863* (2013.01); *G01S 7/4876* (2013.01);
(Continued)

(58) Field of Classification Search
CPC ......... H01L 27/14634; H01L 27/14643; H01L 25/065; H01L 25/50
(Continued)

(56) References Cited

U.S. PATENT DOCUMENTS 799,465 A 9/1905 Hoernes
6,906,793 B2 6/2005 Bamji et al.
(Continued)

FOREIGN PATENT DOCUMENTS

JP 2000-241134 A 9/2000
JP 2007-228460 A 9/2007
(Continued)

OTHER PUBLICATIONS

Oct. 4, 2016 International Preliminary Report on Patentability issued in International Patent Application No. PCT/JP2015/060264.
(Continued)

*Primary Examiner* — Seung C Sohn
(74) *Attorney, Agent, or Firm* — Oliff PLC

(57) ABSTRACT

A detector comprises a plurality of photoelectric converters to output an electrical signal corresponding to an incident light, and a plurality of filter circuits provided corresponding to each of the plurality of photoelectric converters or to each of a plurality of element groups respectively including a predetermined number of the photoelectric converters of the plurality of photoelectric converters, the plurality of filter circuits attenuating a signal having a predetermined frequency from the electrical signal output from the plurality of photoelectric converters,
In the above-described detector, the plurality of photoelectric converters may be provided in a first substrate, and the plurality of filter circuits may be provided in a second substrate laminated on the first substrate.

23 Claims, 25 Drawing Sheets

(51) Int. Cl.

| | |
|---|---|
| *H01L 25/07* | (2006.01) |
| *H01L 25/18* | (2006.01) |
| *H01L 31/10* | (2006.01) |
| *H04N 5/3745* | (2011.01) |
| *H01L 25/00* | (2006.01) |
| *G01S 17/89* | (2006.01) |
| *G01S 7/486* | (2006.01) |
| *G01S 7/487* | (2006.01) |
| *G01S 7/491* | (2006.01) |
| *G01S 7/493* | (2006.01) |

(52) U.S. Cl.
CPC ............ *G01S 7/493* (2013.01); *G01S 7/4914* (2013.01); *G01S 17/89* (2013.01); *H01L 25/065* (2013.01); *H01L 25/07* (2013.01); *H01L 25/18* (2013.01); *H01L 25/50* (2013.01); *H01L 27/14643* (2013.01); *H01L 31/10* (2013.01); *H04N 5/3745* (2013.01); *H01L 2924/0002* (2013.01)

(58) Field of Classification Search
USPC ...................................................... 250/208.1
See application file for complete search history.

(56) References Cited

U.S. PATENT DOCUMENTS

| | | |
|---|---|---|
| 9,184,190 B2 | 11/2015 | Sato et al. |
| 2002/0084430 A1 | 7/2002 | Bamji et al. |
| 2003/0076484 A1 | 4/2003 | Bamji et al. |
| 2003/0223053 A1 | 12/2003 | Liu et al. |
| 2005/0156121 A1 | 7/2005 | Bamji et al. |
| 2006/0128087 A1 | 6/2006 | Bamji et al. |
| 2010/0110271 A1* | 5/2010 | Yanagita ........... H01L 27/14623 348/340 |
| 2010/0110607 A1 | 5/2010 | DeNatale et al. |
| 2010/0151303 A1 | 6/2010 | Marple et al. |
| 2010/0221588 A1 | 9/2010 | Marple |
| 2011/0250490 A1 | 10/2011 | Marple |
| 2012/0021266 A1 | 1/2012 | Marple et al. |
| 2013/0034762 A1 | 2/2013 | Marple et al. |
| 2013/0270666 A1 | 10/2013 | Sato et al. |
| 2014/0002700 A1* | 1/2014 | Oishi ..................... H04N 5/369 348/273 |

FOREIGN PATENT DOCUMENTS

| | | |
|---|---|---|
| JP | 2009-170448 A | 7/2009 |
| JP | 2010-040594 A | 2/2010 |
| JP | 2011-192853 A | 9/2011 |
| JP | 2012-049547 A | 3/2012 |
| JP | 2012-099580 A | 5/2012 |
| JP | 2014-220559 A | 11/2014 |
| WO | 2004/046750 A2 | 6/2004 |

OTHER PUBLICATIONS

Jun. 16, 2015 International Search Report issued in Patent Application No. PCT/JP2015/060264.

Nov. 17, 2017 Extended Search Report issued in European Patent Application No. 15773067.2.

Nov. 14, 2017 Office Action issued in Japanese Patent Application No. 2016-511963.

* cited by examiner

DETECTOR, DETECTOR WITH LOCK-IN AMPLIFIER, SUBSTRATE, AND METHOD FOR MANUFACTURING A DETECTOR

BACKGROUND

1. Technical Field

The present invention relates to a detector, a lock-in detection device, a substrate, and a method for manufacturing a detector.

2. Related Art

There has been a solid state imaging device combining a photodiode and a lock-in amplifier (for example, refer to Patent Document 1). In the solid state imaging device, a circuit added for each pixel is increased or enlarged, an aperture rate drops and a performance as an imaging device is limited.

[Patent Document 1] Japanese Patent Application Publication No. 2010-040594

SUMMARY

In a first aspect of the present invention, a detector is provided, including a plurality of photoelectric converters to output an electrical signal corresponding to an incident light, and a plurality of filter circuits provided corresponding to each of the plurality of photoelectric converters or to each of a plurality of element groups respectively including a predetermined number of the photoelectric converters of the plurality of photoelectric converters, the plurality of filter circuits attenuating a signal having a predetermined frequency from the electrical signal output from the plurality of photoelectric converters.

In a second aspect of the present invention, a detector is provided, including a photoelectric converter that outputs an electrical signal corresponding to an incident light, a reduction section that reduces, from the electrical signal output from the photoelectric converter, a background light component corresponding to a background light included in the incident light, and a multiplication section that multiplies, by a reference signal modulated in intensity, the electrical signal in which the background light component is reduced by the reduction section.

In a third aspect of the present invention, a detector is provided, including a first substrate having a photoelectric converter that outputs an electrical signal corresponding to an incident light, and a second substrate having a reduction section that reduces, from the electrical signal output from the photoelectric converter, a component corresponding to a background light included in the incident light, the second substrate laminated on the first substrate.

In a fourth aspect of the present invention, a lock-in detection device including the above-described detector is provided.

In a fifth aspect of the present invention, a method for manufacturing a detector is provided, including a first step of forming a plurality of photoelectric converters that output an electrical signal corresponding to an incident light, and a second step of forming a plurality of filter circuits corresponding to each of the plurality of photoelectric converters or to each of a plurality of element groups respectively including a predetermined number of the photoelectric converters of the plurality of photoelectric converters, the plurality of filter circuits attenuating a signal having a predetermined frequency from the electrical signal output from the plurality of photoelectric converters.

In a sixth aspect of the present invention, a method for manufacturing the detector according to claim 30 is provided, in which the first step includes a step of forming the plurality of photoelectric converters in a first substrate, and the second step includes a step of forming the plurality of filter circuits in a second substrate, and the method includes a third step of alternately laminating the first substrate and the second substrate.

In a seventh aspect of the present invention, a method for manufacturing a detector is provided, including a step of forming, in a first substrate, a photoelectric converter that outputs an electrical signal corresponding to an incident light, a step of forming, in a second substrate, a reduction section that reduces a component corresponding to a background light included in the incident light from the electrical signal output from the photoelectric converter, and a step of alternately laminating the first substrate and the second substrate.

The summary clause of the above invention does not necessarily describe all necessary features of the embodiments of the present invention. The present invention may also be a sub-combination of the features described above.

DESCRIPTION OF EXEMPLARY EMBODIMENTS

The embodiments do not limit the invention according to the claims, and all the combinations of the features described in the embodiments are not necessarily essential to means provided by aspects of the invention.

Figure 1:
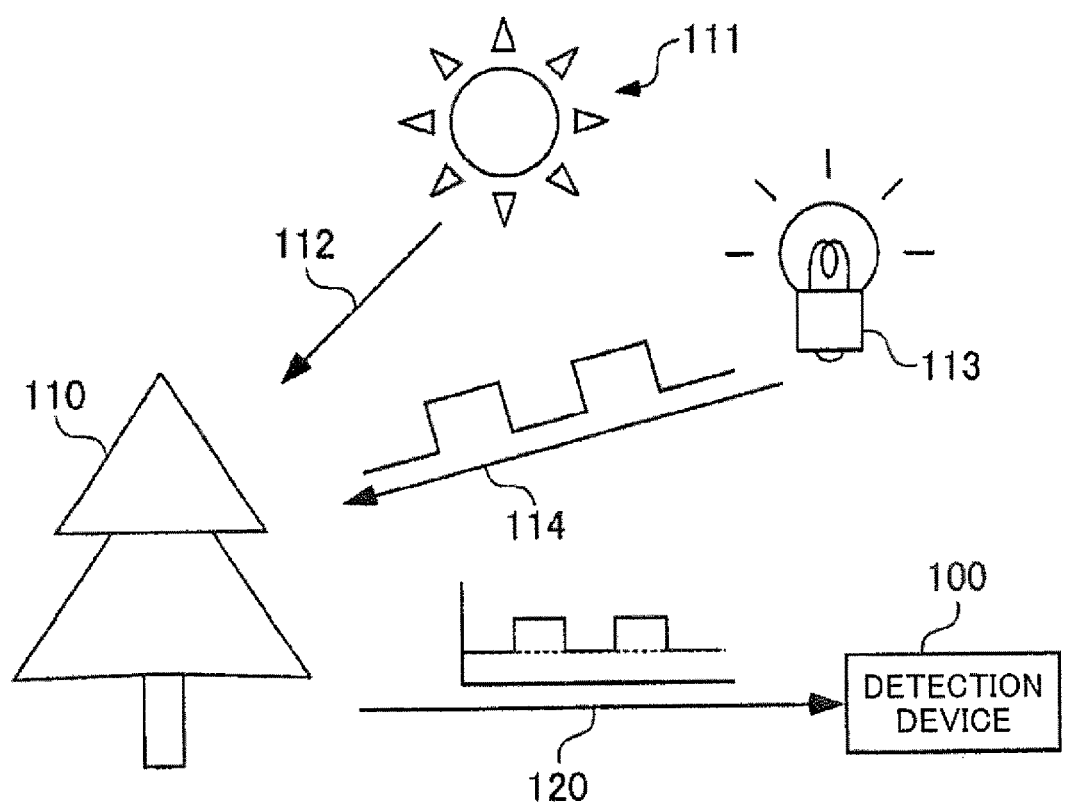
FIG. 1 is a schematic view describing an operation of a detection device 100.

FIG. 1 is a schematic view describing an operation of a detection device 100. The detection device 100 receives a reflection light 120 of a detection object 110 illuminated by a modulated illumination light 114 generated by a illumination light source 113 and amplifies by a lock-in amplifier that is synchronous with the modulated illumination light 114. Accordingly, the reflection light derived from the modulated illumination light 114 generated by the illumination light source 113 is detected, a signal reflecting a phase and an amplitude of the reflection light 120 is detected, and information about a distance to the detection object 110 and the like are calculated. The illumination light source 113 is, for example, a LED or a laser, and a frequency of the modulated illumination light 114 is, for example, about 10 KHz to 1 MHz.

However, in a case where the detection object 110 is illuminated by a natural light 112 generated by a natural light source 111 such as the sun, a background light is included in the reflection light 120, which includes lights ranged from a stationary light derived from the natural light 112 to a light having a frequency of about several KHz. Therefore, in order to improve detection accuracy according to the detection device 100, it is preferable to remove such a background light component from the reflection light 120 of the detection object 110.

Figure 2:
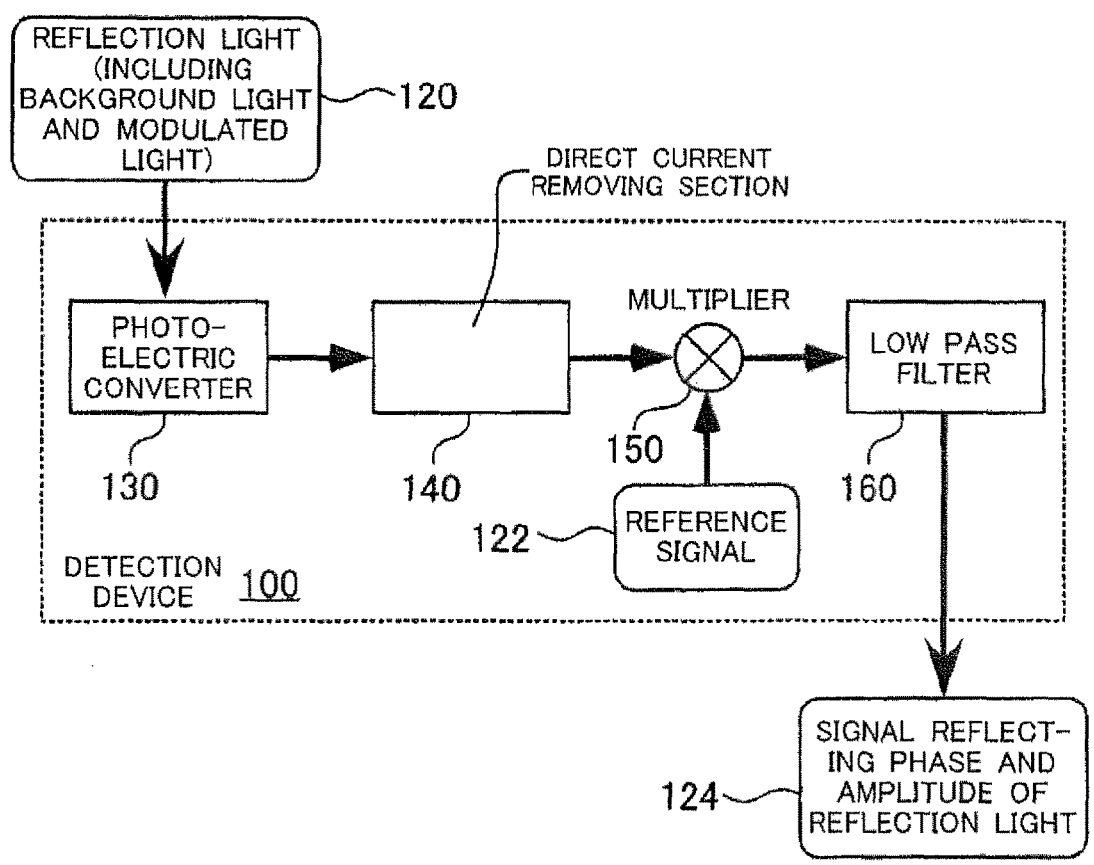
FIG. 2 is a block diagram of the detection device 100.

FIG. 2 is a block diagram of the detection device 100. The detection device 100 includes a photoelectric converter 130, a direct current removing section 140, a multiplier 150, and a low pass filter 160.

The photoelectric converter 130 receives the reflection light 120 from the detection object 110 and converts the light into an electrical signal corresponding to the light intensity. The direct current removing section 140 removes, from the electrical signal output by the photoelectric converter 130, a background light component including a direct current component derived from the background light.

The multiplier 150 multiplies, by a reference signal 122 synchronous with the illumination light source 113, the electrical signal from which the background light component is removed, and then the detection device 100 outputs, according to an integration processing performed by the low pass filter 160, a signal 124 reflecting a phase and an amplitude of the reflection light generated by the modulated illumination light 114 being reflected by the detection object 110.

Furthermore, the photoelectric converter 130 includes many light-receiving sections as pixels, and a process of converting the reflection light 120 into the electrical signal is performed for each pixel. Therefore, the detection device 100 can be used as an image sensor by which distance information for each pixel is obtained, and in addition, also can be used as a sensor for a monitor camera, an automatic operation device and the like. For this reason, it is preferable that a plurality of the direct current removing sections 140, a plurality of the multipliers 150, a plurality of the low pass filters 160 and the like are also provided, as a whole detection device 100, for each pixel or for each group including at least a constant number of pixels.

Figure 3:
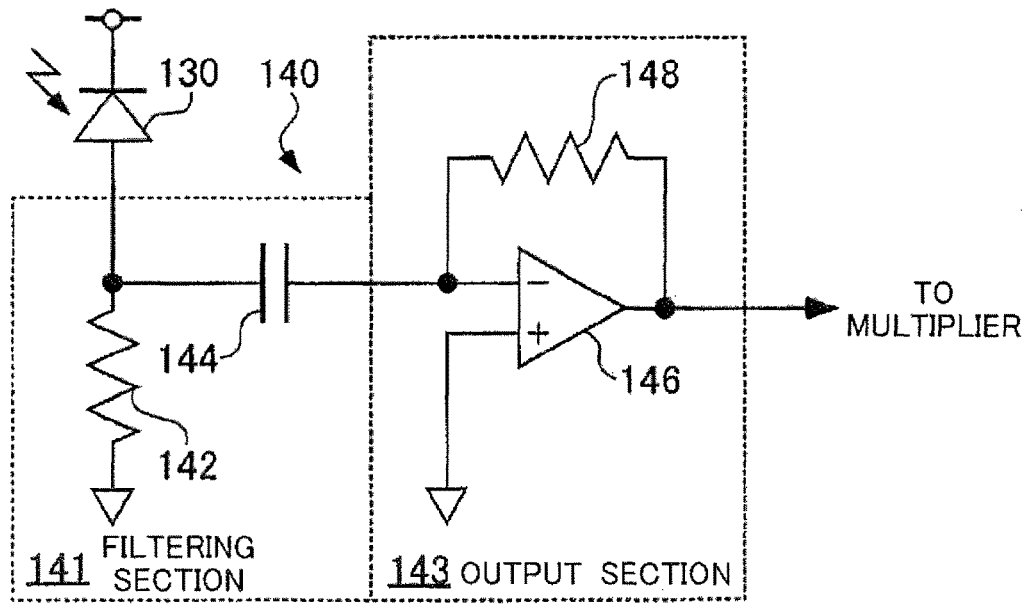
FIG. 3 is a drawing showing a basic configuration of a direct current removing section 140.

FIG. 3 is a drawing showing a basic configuration of the direct current removing section 140 receiving an output from the photoelectric converter 130. The direct current removing section 140 includes a filtering section 141 that is a filter circuit and an output section 143.

The filtering section 141 includes a high pass filter, which is formed by a resistor 142 and a capacitor 144. Accordingly, a bandwidth lower than a cutoff frequency is blocked from an output signal of the photoelectric converter 130. Accordingly, the background light component is attenuated from the output signal of the photoelectric converter 130.

The output section includes an operational amplifier 146 coupling an output and an inverted input via a resistor 148. A non-inverted input of the operational amplifier 146 is coupled to a reference voltage. Accordingly, an output impedance of the direct current removing section 140 can be substantially set to zero.

Figure 4:
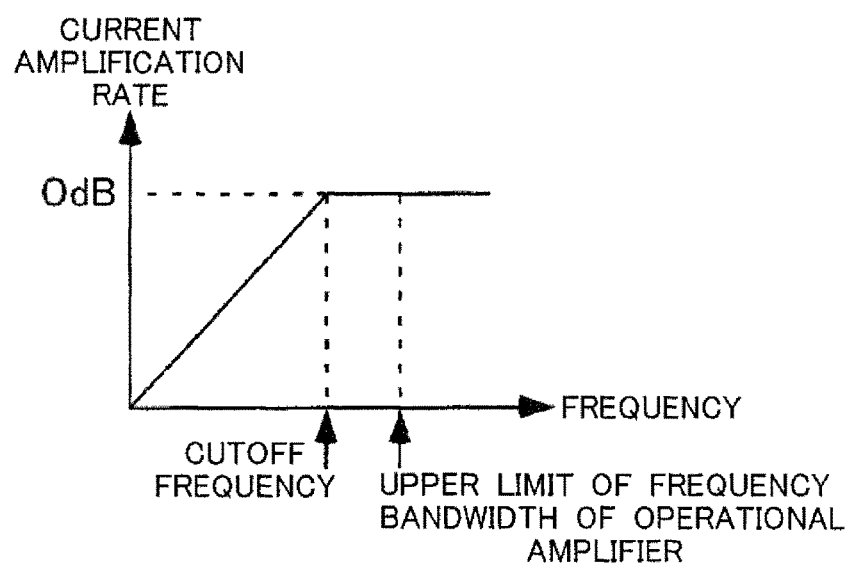
FIG. 4 is a graph showing characteristics of the direct current removing section 140.

FIG. 4 is a graph showing characteristics of the direct current removing section 140. In the direct current removing section 140, no significant output signal is obtained if no signal of a bandwidth lower than an upper limit of a frequency bandwidth is input in the operational amplifier 146. It is preferable that the cutoff frequency is a frequency with which the background light component can be attenuated from the output signal and a sufficient light amount for the detection of the distance information and the like can be obtained, and it is preferable that the cutoff frequency is equal to or greater than 100 Hz and is equal to or less than 100 MHz. Therefore, for a resistance value of the resistor 142 and a capacity of the capacitor 144, which form the filtering section 141, a value is selected, with which the cutoff frequency corresponding to the frequency characteristics of the operational amplifier 146 is obtained.

However, as the resistance value of the resistor 142 and the capacity of the capacitor 144 become large, the sizes of these elements also become large. For this reason, if the direct current removing section 140 is implemented for each pixel of the photoelectric converter 130, each pixel size becomes large and an effective aperture rate of the detection device 100 drops.

Figure 5:
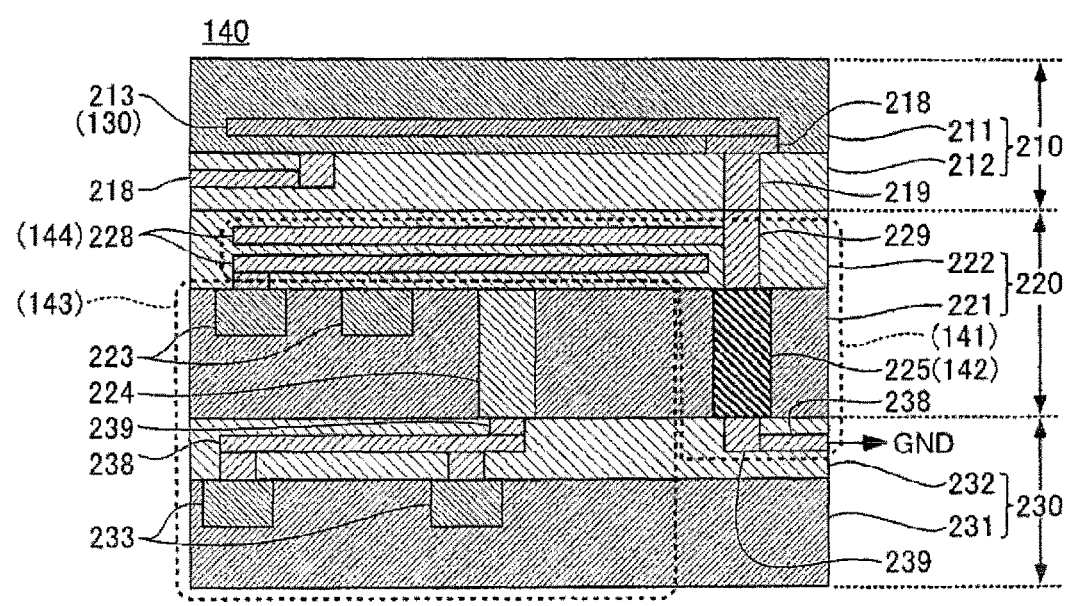
FIG. 5 is a schematic cross-sectional view showing a structure of the direct current removing section 140.

FIG. 5 is a schematic cross-sectional view showing a structure of the direct current removing section 140 in the detection device 100 formed as an integrated circuit. In the present embodiment, the direct current removing section 140 is formed laminating a first substrate 210, a second substrate, and a third substrate 230.

The first substrate 210 includes a substrate 211 and a laminated circuit section 212. The substrate 211 is formed of a semiconductor substrate such as silicon monocrystal and includes a light-receiving section 213 and a wiring section 218, which are formed by a photolithography technique.

The light-receiving section 213 has a photodiode formed by injecting P type impurities in an N type well, for example. The light-receiving section 213 outputs the electrical signal in response to the light intensity of the incident light that is incident from the upper side of the drawing through the substrate 211. In this manner, the first substrate 210 forms a light-receiving substrate of back surface irradiation type.

The laminated circuit section 212 includes the wiring section 218 and a connection section 219, which are formed by the photolithography technique. The wiring section 218 is coupled to circuits and elements which are formed in other regions of the substrate 211, and is also coupled to a voltage source and the like. The connection section 219 is exposed on a front surface of the first substrate 210, and is electrically coupled relative to a connection section 229 of the second substrate 220 laminated on the first substrate 210.

The second substrate 220 has a substrate 221 and a laminated circuit section 222 that is a wiring layer. The substrate 221 is formed of a semiconductor substrate such as silicon monocrystal, and has a conductive via 224, a resistance via 225, and a transistor section 223, which are formed by the photolithography technique.

The conductive via 224 has a conductive material of a low electrical resistance such as the metal filling a through hole formed penetrating the substrate 221 in a thickness direction. Accordingly, for example, in a case where copper is used as the conductive material, the conductive via 224 having a resistivity ρ of about $1.5 \times 10^{-8}$ (Ω·m) electrically couples the front and rear sides of the substrate 221.

The resistance via 225 has a material of high electrical resistance such as polysilicon that has a resistivity ρ of about 0.1 (Ω·m), the material filling the through hole formed penetrating the substrate 221 in the thickness direction. Accordingly, the resistance via 225 can be used as the resistors 142, 148 between the front and rear sides of the substrate 221. The transistor section 223 forms the P type field effect transistor formed by injecting the p type impurities in the N type well, for example.

The laminated circuit section 222 of the second substrate 220 includes a wiring section 228 and the connection section 229, which are formed by the photolithography technique. The wiring section 228 is formed in two layers at intervals in the thickness direction of the laminated circuit section 222. The connection section 229 is provided penetrating the laminated circuit section 222, and is coupled to the connection section 219 of the first substrate laminated on the second substrate 220 on the upper side of the drawing. Accordingly, the resistance via 225 of the second substrate is electrically coupled to the first substrate 210. The resistors 142, 148 have electric resistance values higher than that of the connection section 229 that is a wiring receiving the electrical signal from the photoelectric converter 130. Also, the resistors 142, 148 have diameters larger than a diameter of the connection section 229 that is a wiring receiving the electrical signal from the photoelectric converter 130.

The third substrate 230 has a substrate 231 and a laminated circuit section 232. The substrate 231 is formed of a semiconductor substrate such as silicon monocrystal, and has a plurality of transistor sections 233 formed by the photolithography technique. In the third substrate 230, the transistor section 233 forms an N type field effect transistor formed by injecting the N type impurities in a P type well, for example.

The laminated circuit section 232 includes a wiring section 238 and a connection section 239 formed by the photolithography technique. The wiring section 238 is coupled to circuits and elements which are formed in other regions of the substrate 231, and is also coupled to a reference voltage outside and the like at the same time. The connection section 239 is exposed on a front surface of the third substrate 230, and is electrically coupled to the conductive via 224, the resistance via 225 and the like of the second substrate 220. In other words, the third substrate 230 is electrically coupled to the first substrate 210 via the second substrate 220 as a substrate.

In such a direct current removing section 140 described above, the filtering section 141 can be formed by combining the capacitor 144 formed by the wiring section 228 of the second substrate and the resistance via 225 formed in the second substrate 220. Also, the operational amplifier 146 of the output section 143 can be formed by combining the transistor section 223 formed in the second substrate and the transistor section 233 formed in the third substrate 230.

Figure 6:
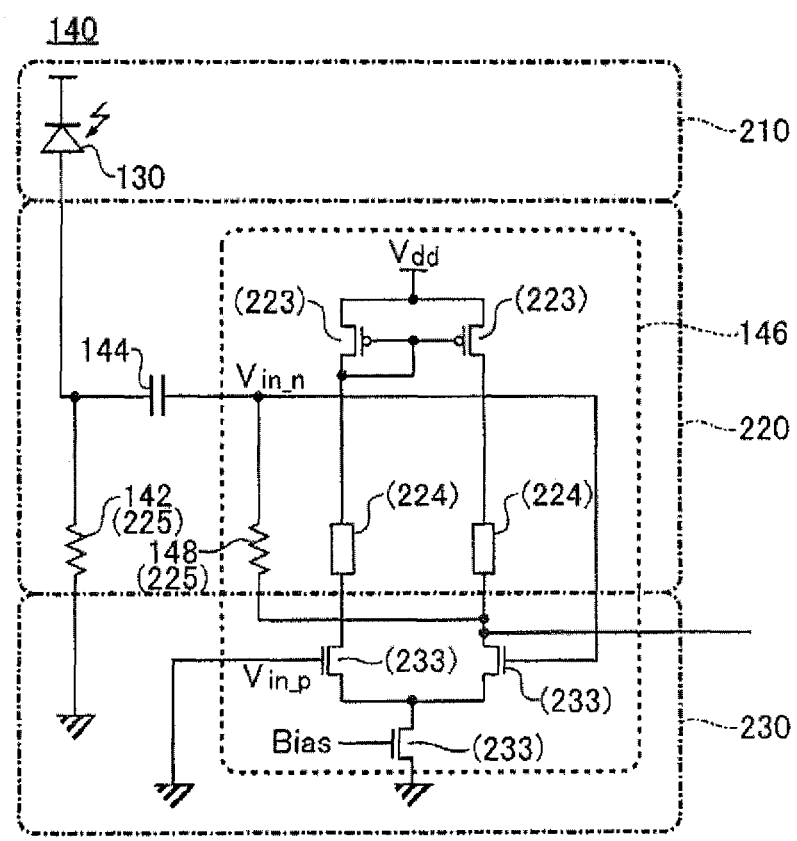
FIG. 6 is a detailed circuit diagram of the direct current removing section 140.

FIG. 6 is a detailed circuit diagram of the direct current removing section 140. In the drawing, in addition to the resistor 142 and the capacitor 144 which form the filtering section 141, the transistor section 223 and the resistor 148 are shown, which form the operational amplifier 146 of the output section 143.

In the direct current removing section 140, the electrical signal generated by the photoelectric converter 130 of the first substrate 210 is transmitted to the output section 143 via the filtering section 141 formed by the resistor 142 and the capacitor 144 in the second substrate 220. In the laminated circuit section 222 of the second substrate 220, the wiring section 228 occupies many portions.

In other words, since there are few other elements in the laminated circuit section 222, the wiring section 228 can form the capacitor 144 of a large capacity by using a large area.

In such a direct current removing section 140 described above, the filtering section 141 is formed by combining the capacitor 144 formed by the wiring section 228 of the second substrate and the resistance via 225 formed in the second substrate 220. Since the capacitor 144 and the resistance via 225 can be formed without being restricted by the presences of the light-receiving section 213 arranged in the first substrate 210 and the circuit formed in the first substrate, the cutoff frequency determined in response to the frequency characteristics of the operational amplifier 146 can be set.

Also, in the direct current removing section 140, the operational amplifier 146 of the output section 143 can be formed by combining the transistor section 223 of P type formed in the second substrate 220 and the transistor section 233 of N type formed in the third substrate 230. In this manner, by using semiconductor substrates of different polarities as the second substrate 220 and the third substrate 230, the implementation density can be improved, compared with a case where the P type transistor and the N type transistor are provided in one substrate.

Figure 7:
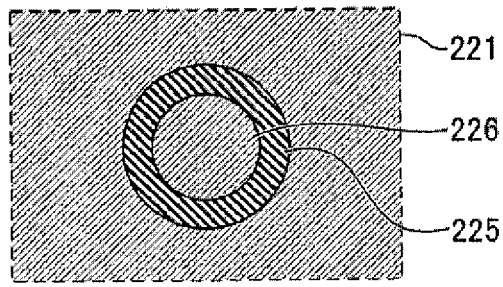
FIG. 7 is a schematic view showing a structure of a resistance via 225.

FIG. 7 is a schematic view showing a structure of the resistance via 225 in the second substrate 220. The drawing shows a shape of the second substrate 220 in a cross section parallel to a surface direction of the second substrate 220.

In the illustrated cross section, the resistance via 225 has an annular shape. In the center of the resistance via 225, a post 226 penetrating the resistance via 225 is arranged. The post 226 is, for example, formed of the same dielectric material as the material of the substrate 221. Accordingly, the electrical resistance value can be set further higher by decreasing an effective cross-sectional area of the resistance via 225 formed of polysilicon and the like and effectively thinning the resistance via 225. Therefore, the setting range of the cutoff frequency of the direct current removing section 140 can be expanded. Also, it is preferable to set a small diameter of the resistance via 225 also from the viewpoint of restraining the parasitic capacity in the resistance via 225.

Figure 8:
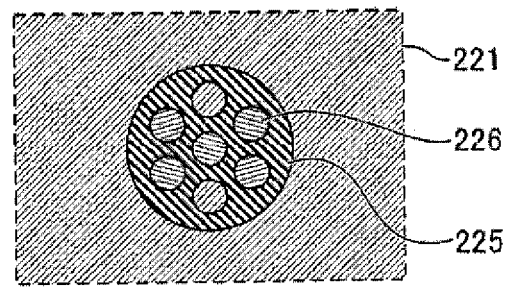
FIG. 8 is a schematic view showing a structure of the resistance via 225.

FIG. 8 is a schematic view showing a structure of the resistance via 225 in the second substrate 220. The drawing shows the shape of the second substrate 220 in the cross section parallel to the surface direction of the second substrate 220.

In the illustrated cross section, the resistance via 225 has a plurality of posts 226 penetrating the substrate 221.

The posts 226 are, for example, formed of the same dielectric material as the material of the substrate 221. Accordingly, since the cross-sectional area of the resistance via 225 formed of polysilicon and the like is further decreased and the resistance via 225 is effectively thinner, the electrical resistance value becomes further higher. Therefore, the setting range of the cutoff frequency in the filtering section 141 of the direct current removing section 140 can be further expanded.

Figure 9:
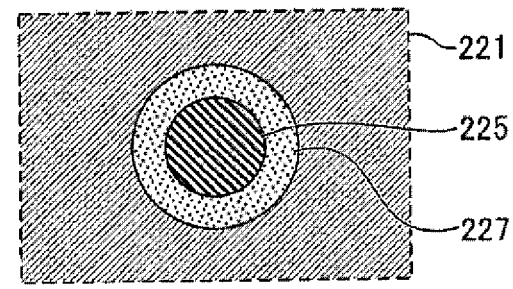
FIG. 9 is a schematic view showing a structure of the resistance via 225.

FIG. 9 is a schematic view showing a structure of the resistance via 225 in the second substrate 220. The drawing shows the shape of the second substrate 220 in the cross section parallel to the surface direction of the second substrate 220.

The illustrated resistance via 225 is formed of a material of high resistance such as polysilicon filling a further inner side of an oxide film 227 formed in an inner surface of a through via formed in the substrate 221. Accordingly, by decreasing the effective cross-sectional area of the resistance via 225 formed of polysilicon and the like, the electrical resistance value can be further higher, and the setting range of the cutoff frequency in the filtering section 141 of the direct current removing section 140 can be further expanded.

Figure 10:
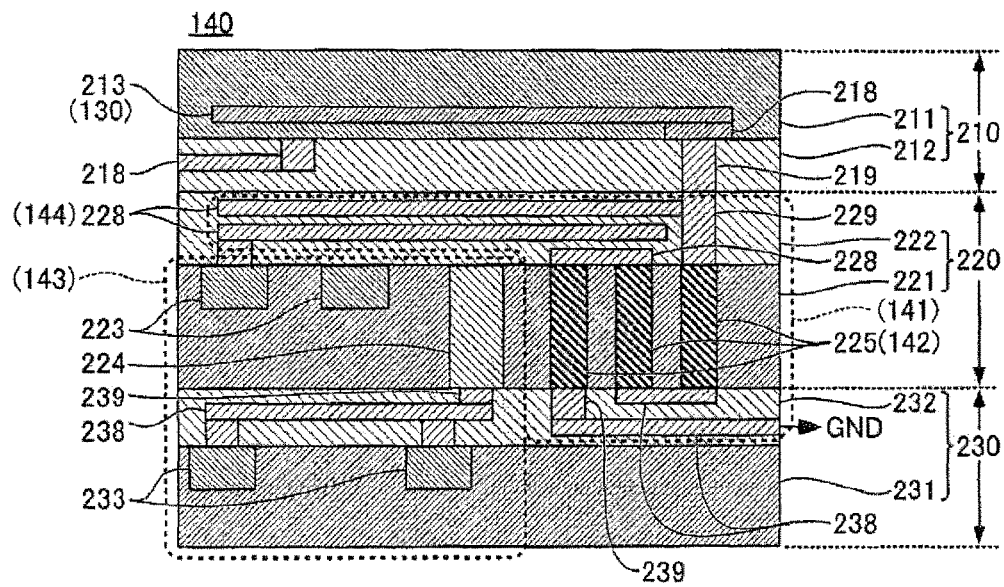
FIG. 10 is a schematic view showing a structure of the resistance via 225.

FIG. 10 is a schematic cross-sectional view showing a structure of the direct current removing section 140 in the detection device 100 formed as an integrated circuit. The direct current removing section 140 shown in the drawing has the same structure as that of the direct current removing section 140 shown in FIG. 5, except a structure of the resistance via 225 which will be described next. Therefore, the same reference numerals are given to the common elements and the repeated descriptions are omitted.

The illustrated direct current removing section 140 has three resistance vias 225 which respectively penetrate the substrate 221. The three resistance vias are connected to each other in series according to the wiring section 228 formed in a lower surface of the laminated circuit section 222 and the wiring section 238 formed in the laminated circuit section 232 of the third substrate 230.

Accordingly, the length of the resistance vias 225 coupling the connection section 229 of the second substrate 220 and the connection section 239 of the third substrate 230 becomes three times, and the resistance value as the resistor 142 also becomes three times. Therefore, the setting range of the cutoff frequency in the filtering section 141 of the direct current removing section 140 can be further expanded.

It should be noted that the number of the resistance vias 225 to couple is not limited to three, which goes without saying. More resistance vias 225 may be coupled to each other, and the thickness of the resistance vias 225 to couple may be changed so as to be able to finely change the setting value.

Figure 11:
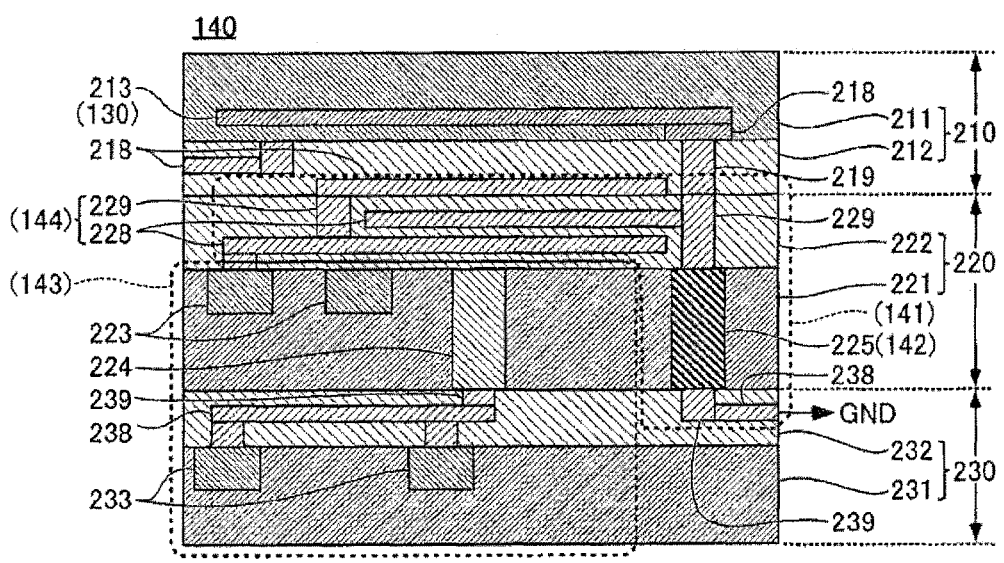
FIG. 11 is a schematic view showing a structure of a capacitor 144.

FIG. 11 is a schematic cross-sectional view showing a structure of the direct current removing section 140 in the detection device 100 formed as an integrated circuit. The direct current removing section 140 shown in the drawing has the same structure as that of the direct current removing section 140 shown in FIG. 5, except a structure of the capacitor 144 which will be described next. Therefore, the same reference numerals are given to the common elements and the repeated descriptions are omitted.

In the illustrated direct current removing section 140, the capacitor 144 is formed by the wiring section 228 extending from the connection section 229 of the second substrate 220 to the left side of the drawing and a pair of the wiring sections 218, 228 sandwiching the wiring section 228 on the upper and lower sides of the drawing. Among the pair of the wiring sections 218, 228, the wiring section 228 on the lower side of the drawing is formed in the laminated circuit section 222 of the second substrate 220, similar to the wiring section 228 in the other direct current removing section 140.

The other wiring section 218 positioned on the upper side of the drawing is formed in the laminated circuit section 212 of the first substrate 210 in the lower surface of the drawing. The pair of these wiring sections 218, 228 are mutually coupled by the connection section 229 of the second substrate. According to such a structure, the capacity of the capacitor 144 can be increased, and the setting range of the cutoff frequency in the filtering section 141 of the direct current removing section 140 can be further expanded.

It should be noted that the number of the wiring sections 218 to form the capacitor 144 is not limited to the above, which goes without saying. Also, for a purpose of avoiding the interference with other elements, the size of a part of the wiring sections 218, 228 may be made different from the other parts of the wiring sections 218, 228.

Figure 12:
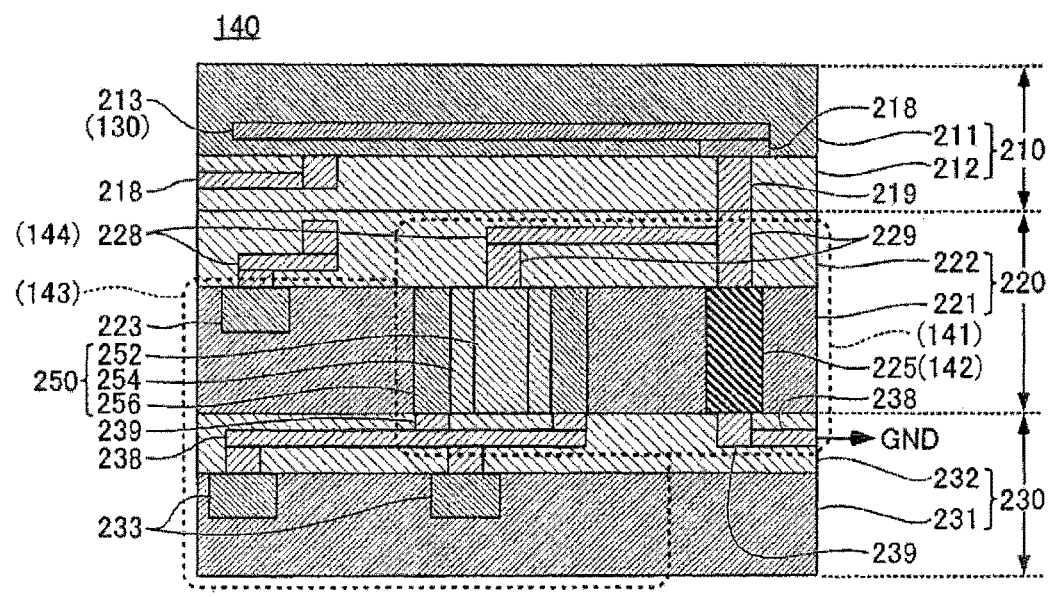
FIG. 12 is a schematic view showing a structure of a capacity via 250.

FIG. 12 is a schematic cross-sectional view showing a structure of the direct current removing section 140 in the detection device 100 formed as an integrated circuit. The direct current removing section 140 shown in the drawing has the same structure as that of the other direct current removing sections 140 shown in FIG. 5 and the like, except a structure of the capacity via 250 which will be described next. Therefore, the same reference numerals are given to the common elements and the repeated descriptions are omitted.

In the illustrated direct current removing section 140, the capacitor 144 is formed by the capacity via 250. The capacity via 250 is located in the through hole formed penetrating the substrate 211 and has the conductive via 252, the dielectric film 254, and the dispersion layer 256, which are formed coaxially around the central axis of the thickness direction of the substrate 211.

The conductive via 252 positioned in the center of the capacity via 250 is formed of a conductive material of low electrical resistance such as the metal, similar to the conductive via 224 in the other direct current removing section 140. The dielectric film 254 is formed of the oxide film and the like covering a circumferential surface of the conductive via 224. The dispersion layer 256 is formed such that the conduction is obtained by diffusing the P type impurities in a case where the N type well is formed in the substrate 221.

Also, the conductive via 252 of the capacity via 250 is coupled to the first substrate 210 from the connection section 229 via the wiring section 228 formed in the laminated circuit section 222 of the second substrate 220. On the other hand, the dispersion layer 256 of the capacity via 250 is coupled to the connection section 239 of the third substrate 230. Accordingly, the capacity via 250 is alternating-current-coupled to the first substrate 210 and to the third substrate 230.

The capacity via 250 is provided in the second substrate 220. Therefore, the capacity can be set, with which the cutoff frequency determined relative to the filtering section 141 is obtained, without considering the interference with the light-receiving section 213 formed in the first substrate 210.

It should be noted that in the above-described embodiment, the resistance via and the capacity via have been described by using some examples. However, the functions of the functional via are not limited to the resistance and the capacity. By selecting the materials, the shapes, and the like of the functional via, the functional via can be formed as a passive element that operates as an inductor, a vibrator, an antenna, a delay line, a resonator, a terminator, and the like, for example.

Figure 13:
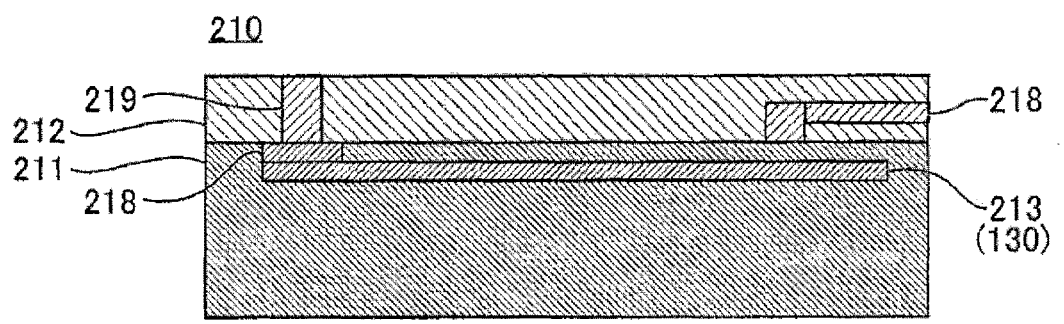
FIG. 13 is a schematic cross-sectional view of a first substrate 210.

FIG. 13 is a schematic cross-sectional view showing the first substrate 210 alone prepared for a case of manufacturing the detection device 100 including the direct current removing section 140 shown in FIG. 5. The same reference numerals are given to the elements common with those in FIG. 5. It should be noted that in the illustrated first substrate 210, opposite to the notation in FIG. 5, the substrate 211 is shown on the lower side of the drawing and the laminated circuit section 212 is shown on the upper side of the drawing.

In the first substrate 210, the light-receiving section 213 is formed in the substrate 211. Also, in the laminated circuit section 212, the wiring section 218 and the connection section 219 are formed. The first substrate 210 has not been thinned at the beginning. Therefore, compared with the first substrate 210 shown in FIG. 5, the substrate 211 is thicker.

Figure 14:
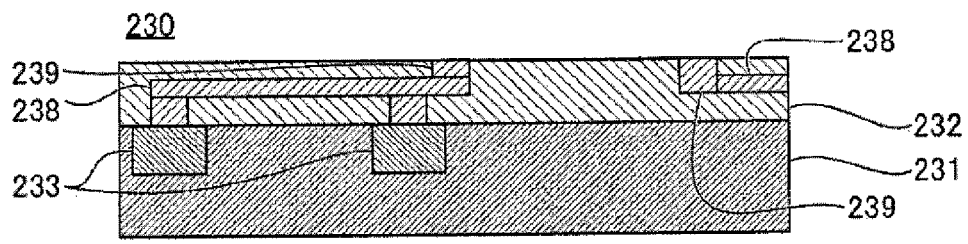
FIG. 14 is a schematic cross-sectional view of a third substrate 230.

FIG. 14 is a schematic cross-sectional view showing the third substrate 230 alone prepared for a case of manufacturing the detection device 100 including the direct current removing section 140 shown in FIG. 5. The same reference numerals are given to the elements common with those in FIG. 5.

In the third substrate 230, a plurality of transistor sections 233 are formed in the substrate 231. Also, in the laminated circuit section 232, the wiring section 238 and the connection section 239 are formed.

Figure 15:
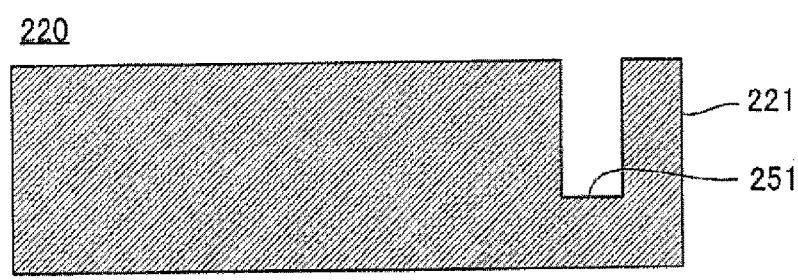
FIG. 15 is a drawing showing a manufacturing process of a second substrate 220.

FIG. 15 is a drawing showing a manufacturing process of the second substrate 220 prepared for a case of manufacturing the detection device 100 including the direct current removing section 140 shown in FIG. 5. The same reference numerals are given to the elements common with those in FIG. 5.

As illustrated, first, a viahole 251 is formed by etching the substrate 211 formed of silicon monocrystal and the like. At this step, since the substrate 221 is not thinned yet, the viahole 251 is not penetrating the substrate 221.

Figure 16:
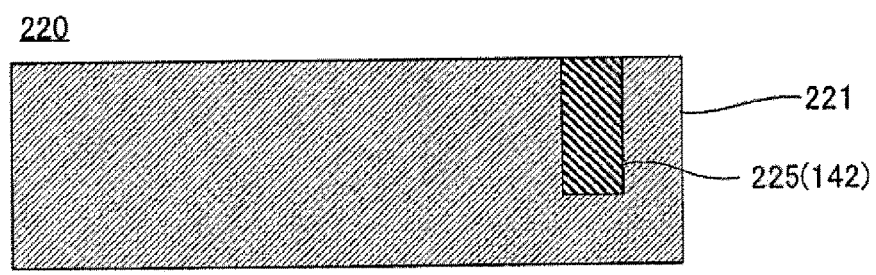
FIG. 16 is a drawing showing a manufacturing process of the second substrate 220.

FIG. 16 is a drawing showing a next manufacturing process of the second substrate 220. A material of high electrical resistance such as polysilicon filling the viahole 251 formed in the substrate 221. Accordingly, the resistance via 225 is formed.

Figure 17:
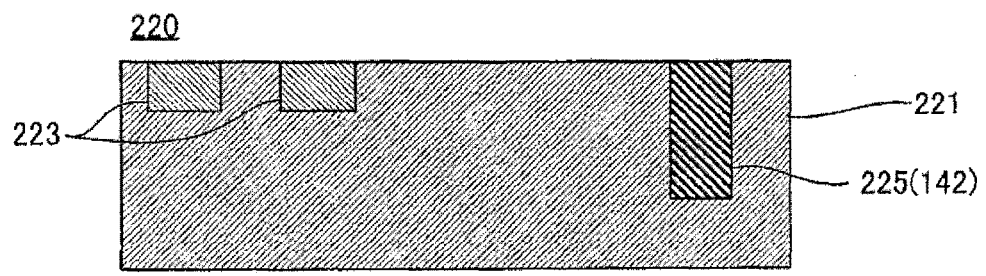
FIG. 17 is a drawing showing a manufacturing process of the second substrate 220.

FIG. 17 is a drawing showing the next manufacturing process of the second substrate 220. Next, by diffusing the P type impurities in the substrate 221 having the N type well, a plurality of transistor sections 223 that are P type field effect transistors are formed. It should be noted that in the present embodiment, the N type field effect transistor which is the different polarity is not formed in the second substrate 220. Accordingly, the number of steps of manufacturing the second substrate 220 can be reduced, and at the same time, the utilization efficiency of the second substrate 220 can be improved.

Figure 18:
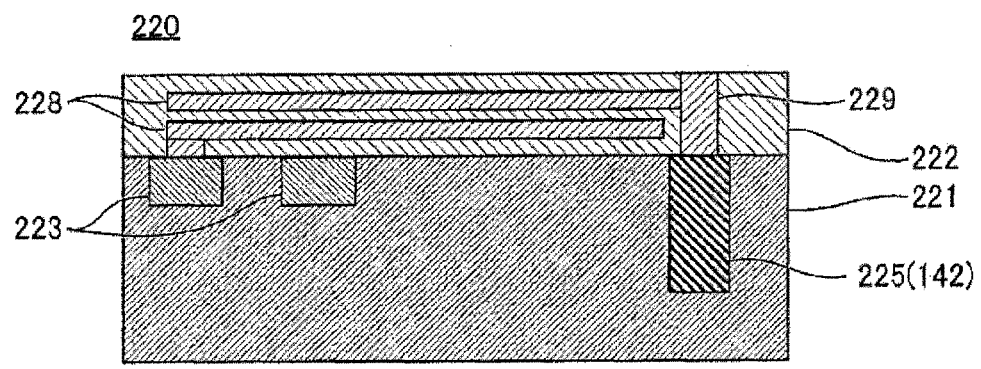
FIG. 18 is a drawing showing a manufacturing process of the second substrate 220.

FIG. 18 is a drawing showing the next manufacturing process of the second substrate 220. Next, in the front surface of the substrate 221, the laminated circuit section 222 is formed by alternately laminating the conductor material and the insulated material which are patterned. Accordingly, the capacitor 144 is formed in the laminated circuit section 222. By using the second substrate 220 prepared in this way as a substrate, the detection device 100 including the direct current removing section 140 can be manufactured by laminating the first substrate 210 shown in FIG. 13 and the third substrate 230 shown in FIG. 14.

It should be noted that in the present embodiment, the conductive via 224 is not formed in the second substrate 220 before laminated. Accordingly, the conductive via 224 can be formed of copper and the like which easily contaminate the substrate. Also, by using the metal as the conductor material forming the capacitor 144, the capacitor 144 having a MIM (metal-insulator-metal) structure can be formed. Accordingly, the resistance of the capacitor can be set low and the capacity density of the laminated circuit section 222 can be improved.

Figure 19:
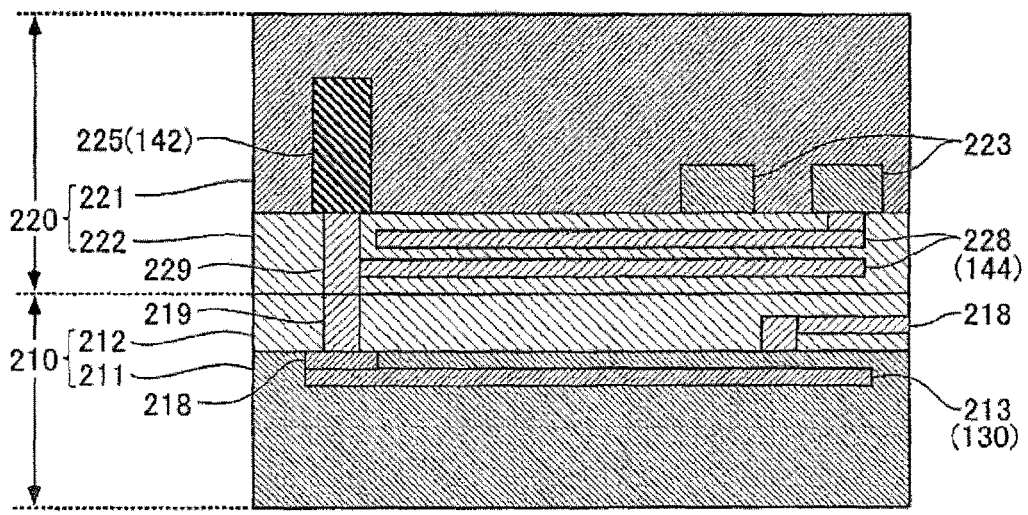
FIG. 19 is a drawing showing a manufacturing process of the direct current removing section 140.

FIG. 19 is the drawing showing a manufacturing process of the direct current removing section 140. The same reference numerals are given to the elements common with those in FIG. 5, FIG. 13, FIG. 14 and FIG. 18.

First, the laminated circuit section 212 of the first substrate 210 and the laminated circuit section 222 of the second substrate 220 are set to be opposite to each other, and the first substrate 210 and the second substrate 220 are laminated and joined. Accordingly, the connection sections 219, 229 are electrically coupled, and the light-receiving section 213 of the first substrate 210 is coupled to the resistor 142 formed by the resistance via 225 and to the capacitor 144 formed by the wiring section 228 of the second substrate 220.

Figure 20:
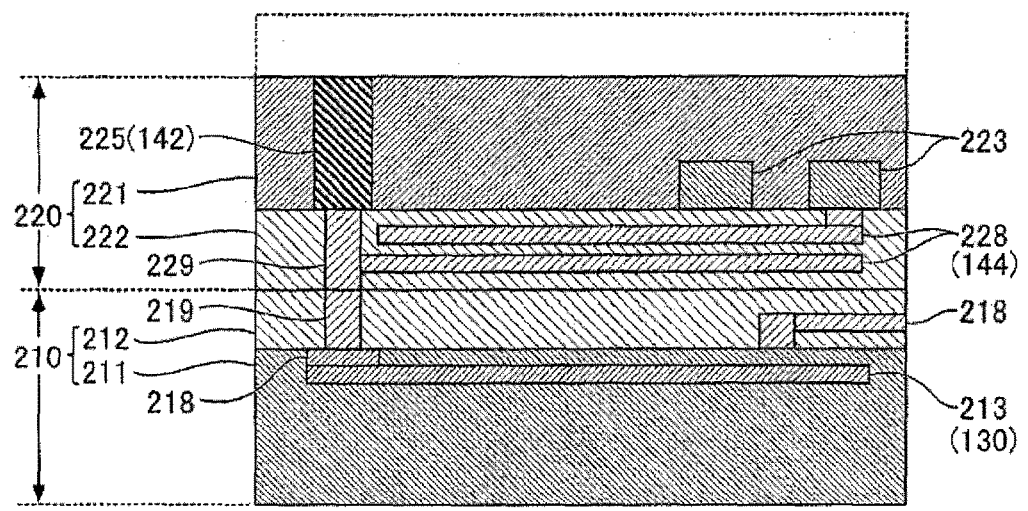
FIG. 20 is a drawing showing a manufacturing process of the direct current removing section 140.

Next, as shown in FIG. 20, in the first substrate 210 and the second substrate 220 which are joined to each other, the substrate 221 of the second substrate 220 is thinned by chemical mechanical polishing. Accordingly, one end of the resistance via 225 in the second substrate 220 is exposed to the front surface of the substrate 211.

Figure 21:
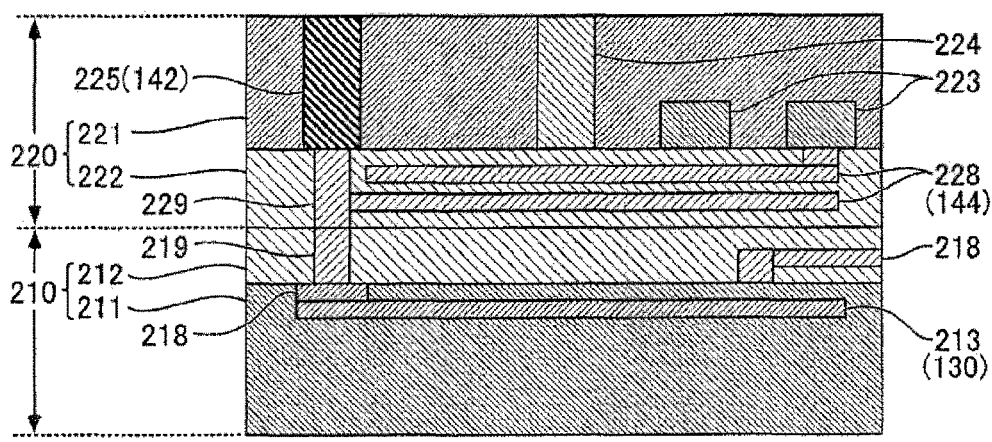
FIG. 21 is a drawing showing a manufacturing process of the direct current removing section 140.

Next, as shown in FIG. 21, and the conductive via 224 is formed in the second substrate 220 by forming the viahole that penetrates the substrate 221 of the second substrate 220 and then filling the viahole with the conductor material. In this way, in the second substrate 220, the conductive via 224 and the resistance via 225 are complete.

Figure 22:
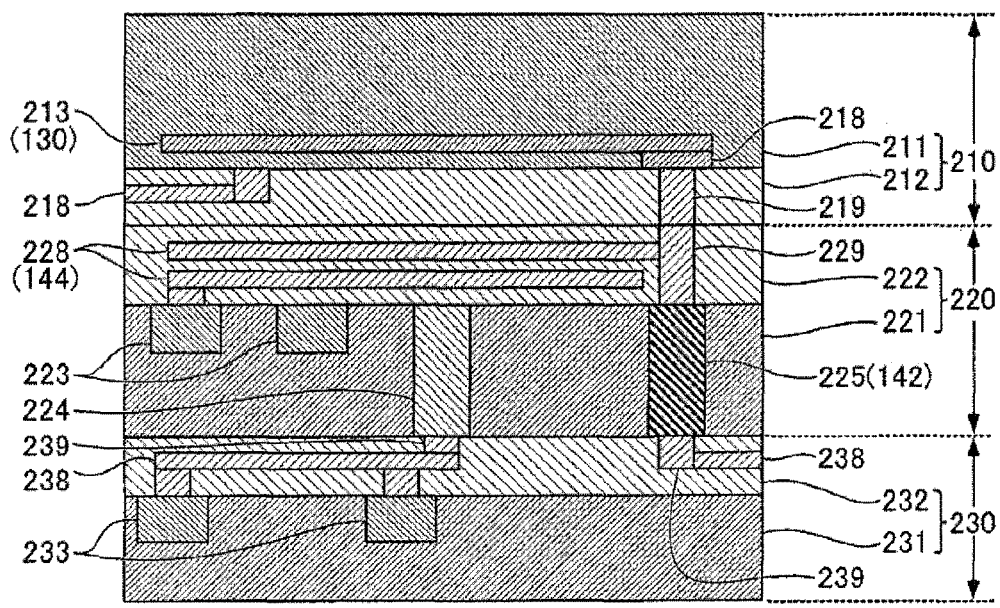
FIG. 22 is a drawing showing a manufacturing process of the direct current removing section 140.

Next, as shown in FIG. 22, the laminated body of the first substrate 210 and the second substrate 220 is laminated on the third substrate 230 and is joined thereto. Here, the conductive via 224 and the resistance via 225, which are exposed on the front surface of the substrate 221 of the second substrate 220, are opposite to the connection section 239 of the third substrate 230. Accordingly, the third substrate is coupled to the first substrate 210 via the second substrate 220. It should be noted that in FIG. 22, the laminated body of the first substrate 210 and the second substrate 220 is inverted from the state shown in FIG. 21.

Figure 23:
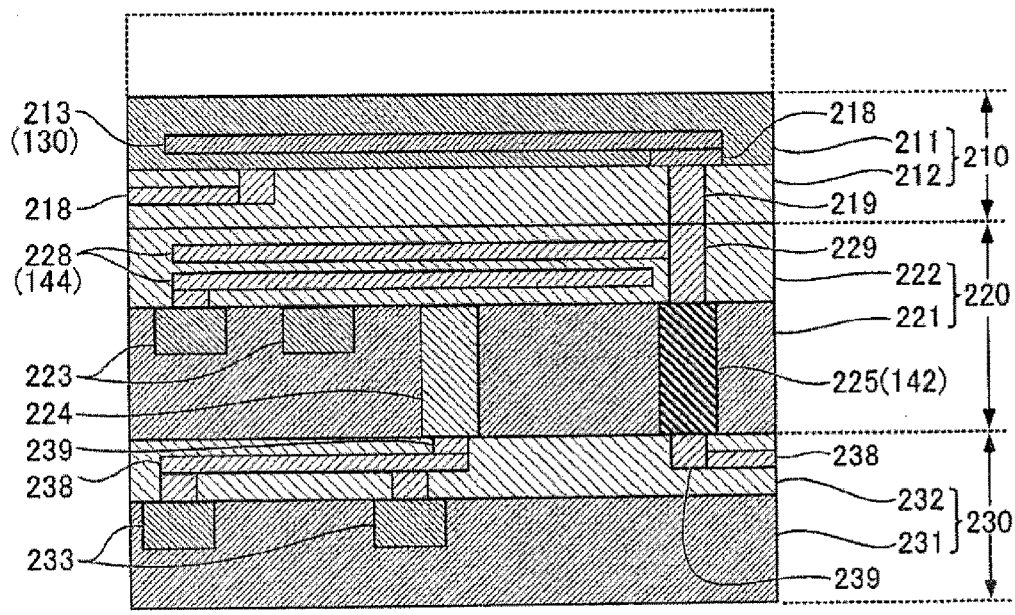
FIG. 23 is a drawing showing a manufacturing process of the direct current removing section 140.

Next, as shown in FIG. 23, the substrate 211 of the first substrate is thinned by chemical mechanical polishing. Accordingly, the light-receiving section 213 is close to the front surface of the substrate 211. In this manner, the first substrate 210 that is a light-receiving substrate becomes a back surface irradiation type to which the light is incident from the substrate 211 side. In this way, the direct current removing section 140 shown in FIG. 5 is complete. It should be noted that the illustrated light-receiving section 213 corresponds to one pixel, and in the detection device 100, a plurality of the illustrated structures are repeatedly formed in a matric shape.

It should be noted that in the above-described example, the conductive via 224 is formed after joining the second substrate 220 to the first substrate 210. However, in a case where a material that is of high heat resistance and hardly contaminates the substrate, such as tungsten and Sn—Bi based material, is used as the material of the conductive via 224, a procedure of forming the conductive via 224 and the resistance via 225 at the same time prior to the step of joining may be used.

Also, the first substrate 210, the second substrate 220 and the third substrate 230 may be laminated and joined by wafer-to-wafer of dicing after collectively laminating and joining the wafers in which a plurality of dies are formed. Also, relative to the plurality of dies on the wafers, the first substrate 210, the second substrate 220, and the third substrate 230 may be laminated and joined to each other by chip-to-wafer of individually laminating and joining dies which are separately prepared. Furthermore, the first substrate 210, the second substrate 220, and the third substrate 230 may be joined to each other by chip-to-chip of laminating a pair of dies.

Figure 24:
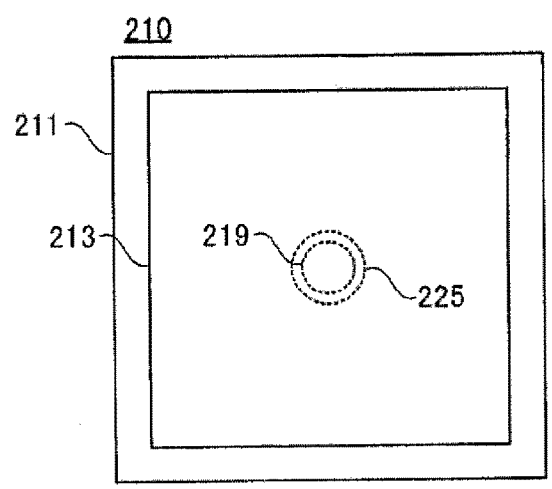
FIG. 24 is a plan view describing a layout of a light-receiving section 213.

FIG. 24 is a plan view describing a layout relating to the light-receiving section 213 of the first substrate 210. In the examples shown from the drawings to FIG. 23, the wiring section 218 is coupled to the vicinity of the edge part of the light-receiving section 213. However, as shown in FIG. 24, the wiring section 218, the connection section 219, and the like may be connected in the center in the surface direction of the light-receiving section 213. Accordingly, charges generated in the photoelectric converter 130 isotropically balance and are transmitted, and the intensity of the output signal is stable.

Figure 25:
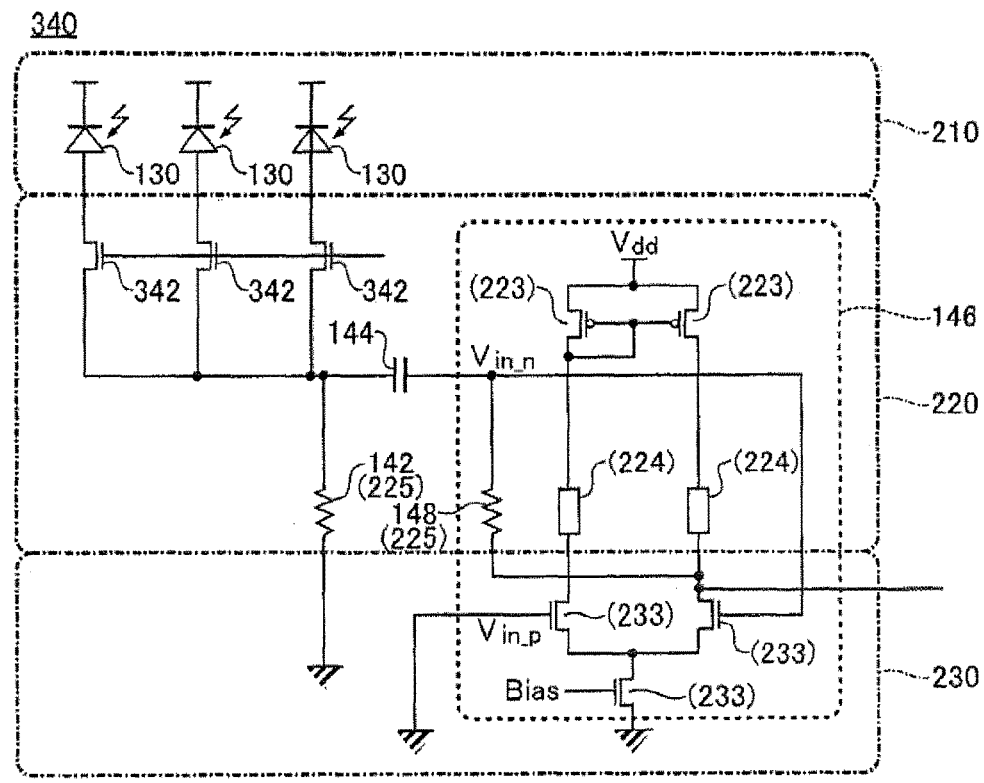
FIG. 25 is a circuit diagram of a direct current removing section 340.

FIG. 25 is a circuit diagram of the other direct current removing section 340. It should be noted that in the direct current removing section 340, each structure of the filtering section 141 and the output section 143 are the same as that of the direct current removing section 140, except portions which will be described next. Therefore, the same reference numerals are given to the common elements and the repeated descriptions are omitted.

The direct current removing section 340 has a structure different from that of the direct current removing section 140 in that a single direct current removing section 340 is coupled relative to a plurality of photoelectric converters 130 formed in the first substrate 210. Each of the photoelectric converters 130 is coupled to the resistor 142 and the capacitor 144 via the switch element 342.

The switch elements 342 couple any of the plurality of photoelectric converters 130 to the direct current removing section 140 by exclusively conducting each other. Accordingly, since many photoelectric converters 130 can be located for the direct current removing section 140, the multiplier 150, and the low pass filter 160, which have a large circuit scale, the aperture rate of the detection device 100 can be improved.

Figure 26:
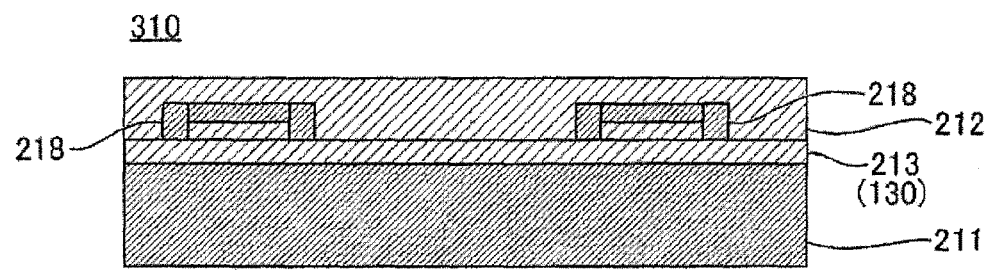
FIG. 26 is a schematic cross-sectional view of a first substrate 310.

FIG. 26 is a schematic cross-sectional view showing the other first substrate 310 alone that may form the detection device 100 including the direct current removing section 140. The first substrate 310 has the substrate 211 and the laminated circuit section 212.

In the first substrate 310, the substrate 211 has the light-receiving section 213 formed by diffusing the impurities. Also, the laminated circuit section 212 has the wiring section 218. The light-receiving section 213 forms the photoelectric converter 130 of front surface irradiation type that receives the incident light via the laminated circuit section 212 between the wiring sections 218. It should be noted that in the illustrated steps, the first substrate 310 does not have the connection section 219.

Figure 27:
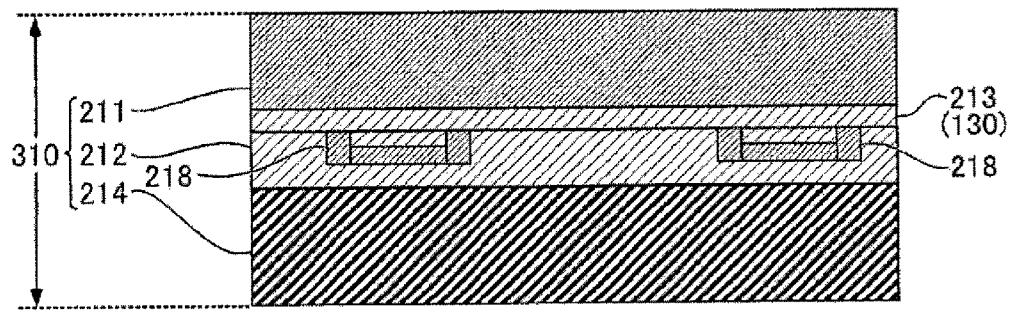
FIG. 27 is a drawing showing a manufacturing process of the direct current removing section 140.

FIG. 27 is a drawing showing a manufacturing process of the direct current removing section 140. In a case of manufacturing the detection device 100 including the direct current removing section 140 by using the first substrate 310, first, a wafer support 214 is attached to the laminated circuit section 212 side of the first substrate 310, that is, to the upper side of the drawing in FIG. 26 and to the lower side of the drawing in FIG. 27.

Figure 28:
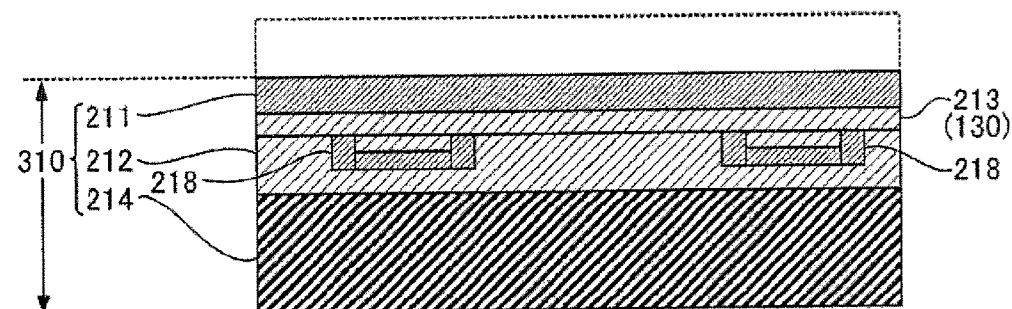
FIG. 28 is a drawing showing a manufacturing process of the direct current removing section 140.

Next, as shown in FIG. 28, the first substrate 310 is thinned by chemical mechanical polishing the substrate 211 of the first substrate 310 in a state where the wafer support 214 side is fixed. Since the first substrate 310 is supported by the wafer support 214, the first substrate 310 can be safely handled even if thinned.

Figure 29:
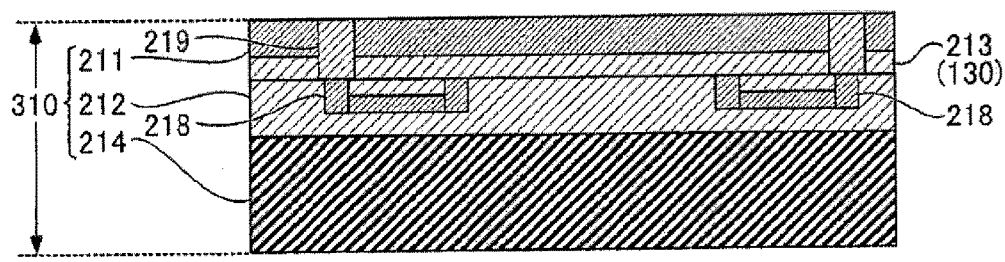
FIG. 29 is a drawing showing a manufacturing process of the direct current removing section 140.

Next, as shown in FIG. 29, the connection section 219 is formed by punching to make a viahole from the substrate 211 side of the first substrate 310 and filling the viahole with the conductive material. Reaching this step, the connection section 219 is complete in the first substrate 310.

Figure 30:
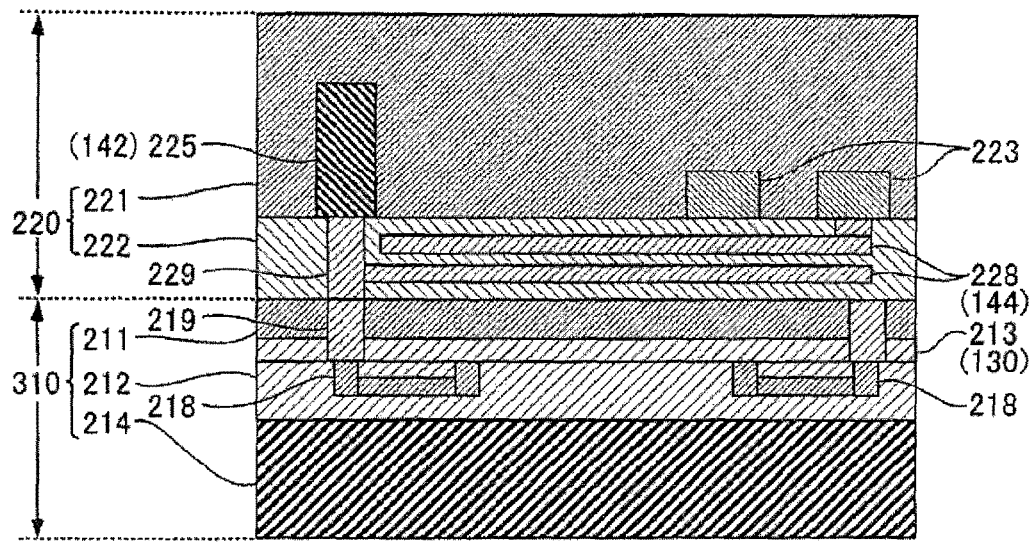
FIG. 30 is drawing showing a manufacturing process of the direct current removing section 140.

Next, as shown in FIG. 30, the second substrate 220 is laminated and joined relative to the first substrate 310. The second substrate 220 laminated here is shown alone in FIG. 18, and has the same structure as that laminated on the first substrate 210 in the step shown in FIG. 19.

In a case where the second substrate 220 is laminated on the first substrate 310, the lamination is performed in a direction where the connection section 219 of the first substrate 310 and the connection section 229 of the second substrate are opposite to each other. Accordingly, the wiring section 218 of the first substrate 210 is electrically coupled to the resistance via 225 of the second substrate via the connection sections 219, 229.

Figure 31:
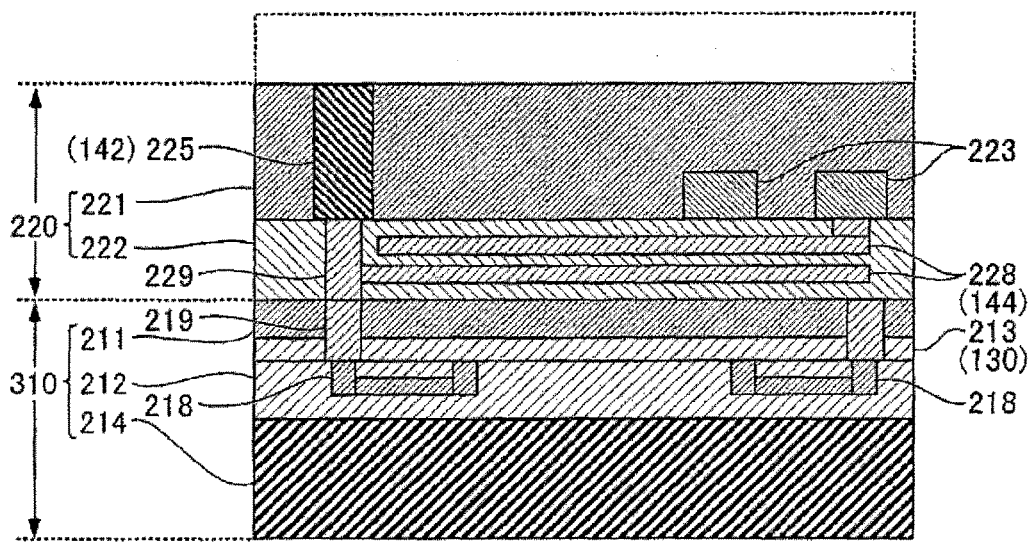
FIG. 31 is a drawing showing a manufacturing process of the direct current removing section 140.

Next, as shown in FIG. 31, the wafer support 214 attached to the first substrate 310 is fixed and the substrate 221 of the second substrate 220 is thinned by chemical mechanical polishing. Accordingly, one end of the resistance via 225 in the second substrate 220 is exposed on the front surface of the substrate 211.

Figure 32:
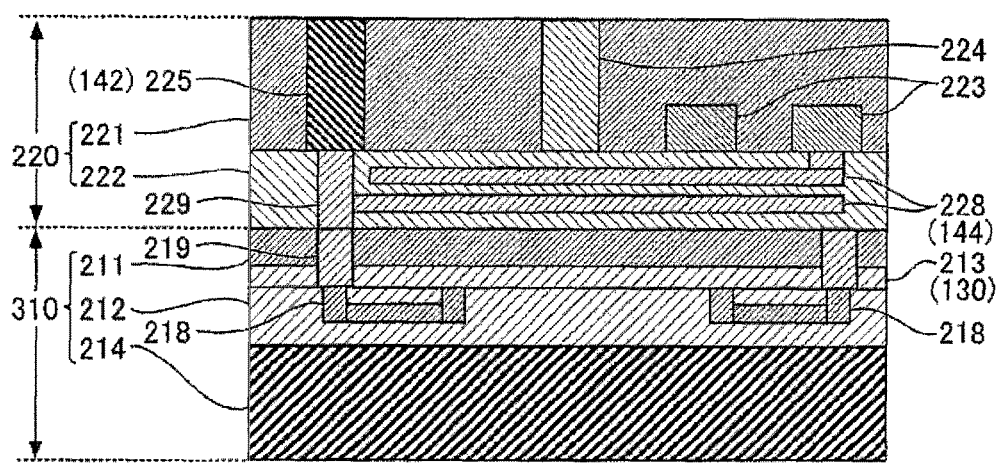
FIG. 32 is a drawing showing a manufacturing process of the direct current removing section 140.

Next, as shown in FIG. 32, a viahole penetrating the substrate 221 of the second substrate 220 is made by punching and is filled with the conductor material. Accordingly, the conductive via 224 is formed in the second substrate 220. In this way, the conductive via 224 and the resistance via 225 are complete in the second substrate 220.

Figure 33:
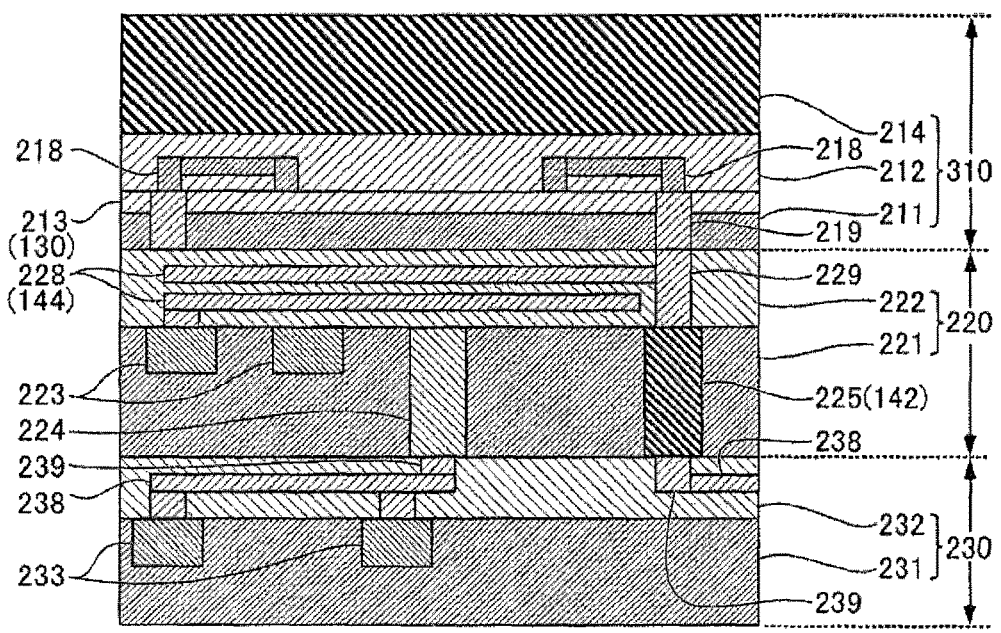
FIG. 33 is a drawing showing a manufacturing process of the direct current removing section 140.

Next, as shown in FIG. 33, the laminated body of the first substrate 310 and the second substrate 220 are laminated and joined on the third substrate 230. The third substrate 230 laminated here is shown alone in FIG. 14, and has the same structure as that laminated on the second substrate 220 in the step shown in FIG. 22.

In a case of laminating the third substrate 230, the conductive via 224 and resistance via 225, which are exposed on the front surface of the substrate 221 of the second substrate 220, are made to be opposite to the connection section 239 of the third substrate 230. Accordingly, the third substrate is coupled to the first substrate 310 via the second substrate 220. It should be noted that in FIG. 33, the laminated body of the first substrate 310 and the second substrate 220 are inverted from the state shown in FIG. 32.

Figure 34:
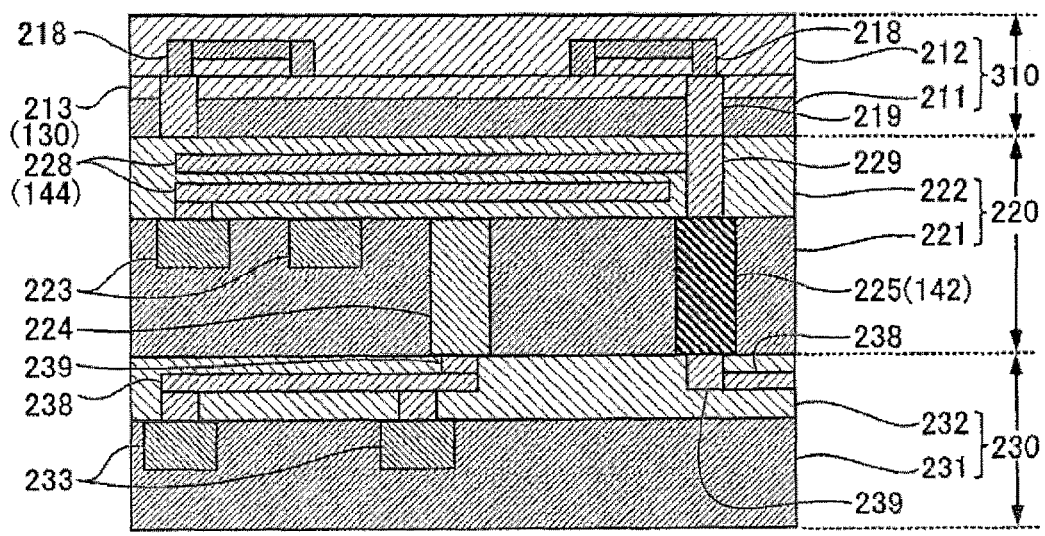
FIG. 34 is a drawing showing a manufacturing process of the direct current removing section 140.

Next, as shown in FIG. 34, the wafer support 214 is peeled from the first substrate 310. In this way, the laminated circuit section 212 of the first substrate 310 is exposed toward outside, and the detection device 100 having the light-receiving section 213 of front surface irradiation type is complete. It should be noted that the illustrated light-receiving section 213 corresponds to one pixel, and in the detection device 100, a plurality of the illustrated structures are repeatedly formed in a matric shape.

In the above-described embodiment, that forming of the lock-in detection device has been described by using examples by means of the functional via. However, the structure using the substrate having the functional via can be used in any laminated semiconductor device. Also, the substrate including the functional via may be supplied alone, for example, as an interposer, for a purpose of laminating in other semiconductor devices.

Figure 35:
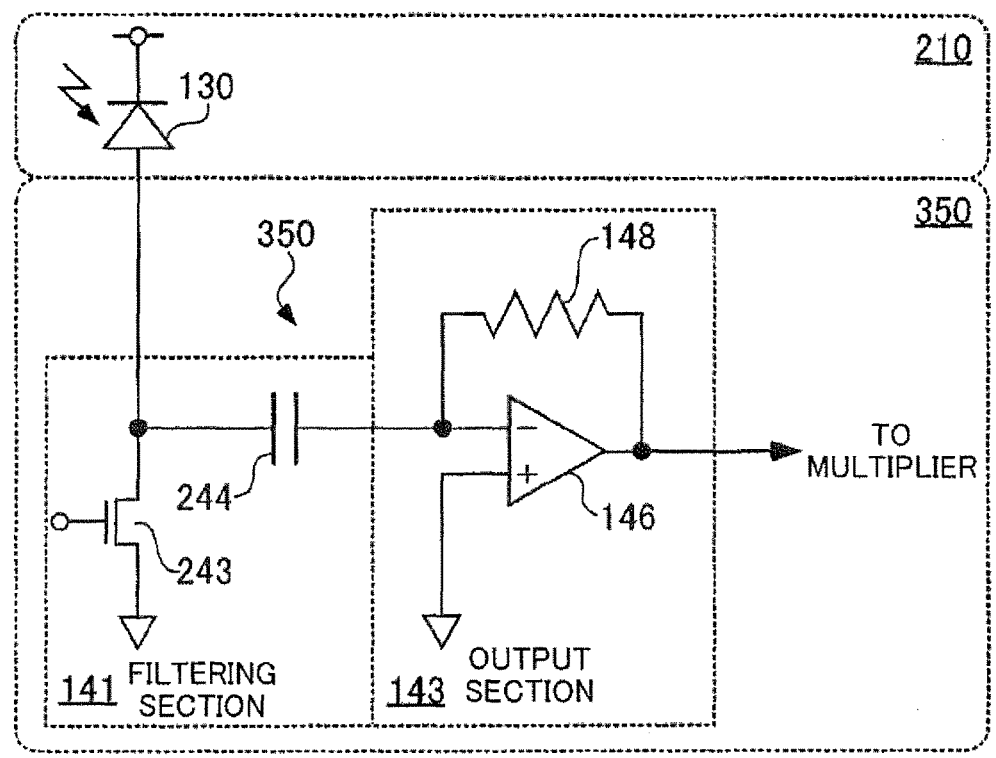
FIG. 35 is a circuit diagram of a direct current removing section 350.

FIG. 35 is a circuit diagram of the other direct current removing section 350. The direct current removing section 350 is formed in a second substrate 240 that is laminated on the first substrate 210 having the photoelectric converter 130. The second substrate 240 has the filtering section 141 and the output section 143. Here, the structure of the output section 143 has the same structure as that of the output section 143 of the direct current removing section 140 shown in FIG. 3. Therefore, the same reference numerals are given to the common elements and the repeated descriptions are omitted.

In the direct current removing section 350, the filtering section 141 has the transistor section 243 and the capacitor 244. In other words, the direct current removing section 350 has a structure in which the resistor 142 is replaced by the transistor section 243 in the direct current removing section 140 of FIG. 3.

Figure 36:
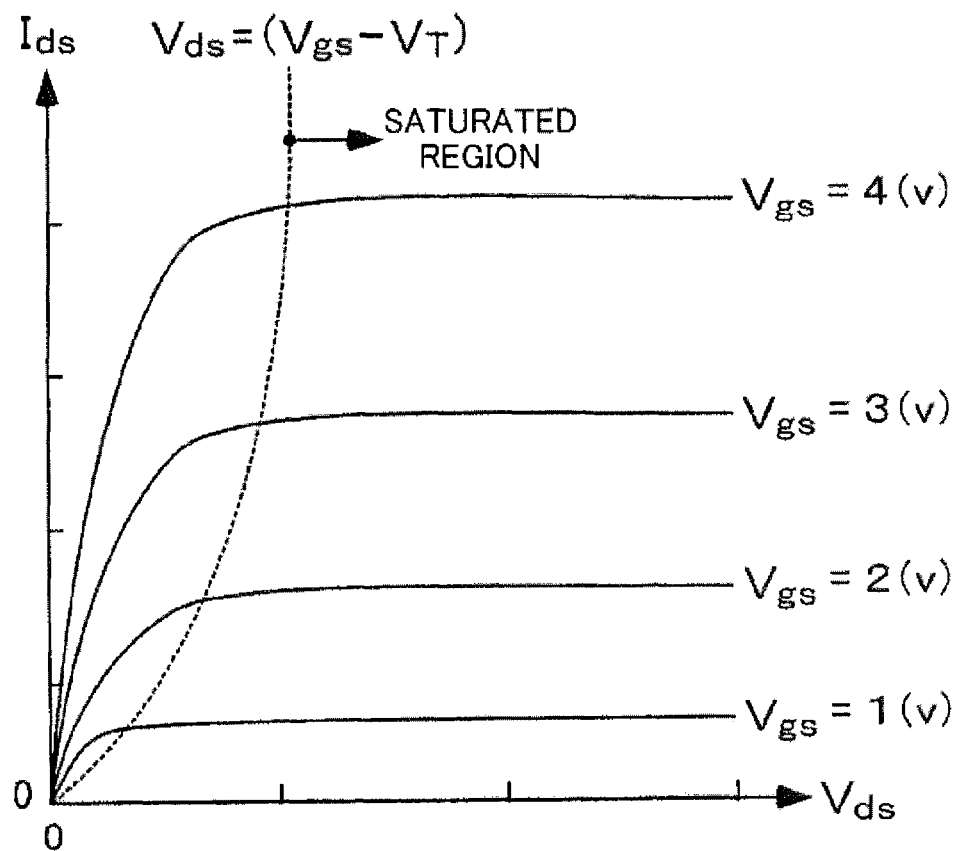
FIG. 36 is a graph showing characteristics of a transistor section 243.

FIG. 36 is a graph showing characteristics of the transistor section 243 formed by the field effect transistor such as MOS-FET. In the transistor section 243, in a case where a voltage $V_{gs}$ between a gate and a source is low, a drain current $I_{ds}$ is increased depending on the gate-source voltage $V_{gs}$.

On the other hand, in the transistor section 243, a region in which a voltage $V_{as}$ between a source and a drain is larger than a difference ($V_{gs}-V_T$) between the voltage $V_{gs}$ which is between the gate and the source and a threshold voltage $V_T$ becomes a saturated region in which the drain current $I_{ds}$ saturates. In the saturated region, it is as if there is an operation performing between the source and the drain as a constant current element. Referring to FIG. 35 again, in the direct current removing section 350, a high pass filter can be formed cooperating with the capacitor 244 by causing the transistor section 243 to operate in the saturated region.

The direct current removing section 350 can form the filtering section 141 having a low cutoff frequency by using the transistor section 243, without depending on the size of the elements. Accordingly, from the output signal of the photoelectric converter 130, the bandwidth lower than the cutoff frequency can be blocked and the background light component can be attenuated, and the operational amplifier 146 of the output section 143 can operate in a bandwidth having effective gains at the same time.

Figure 37:
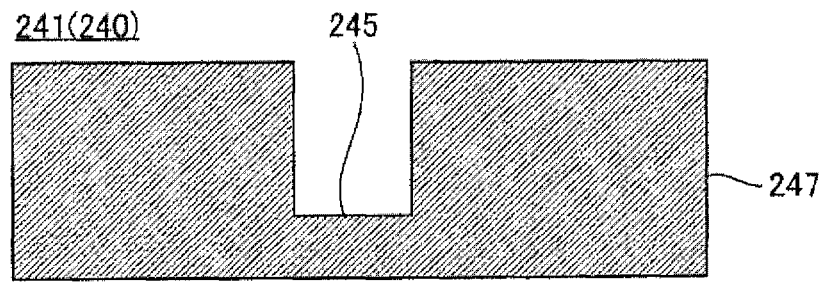
FIG. 37 is a drawing showing a manufacturing process of the second substrate 240.

FIG. 37 is a schematic cross-sectional view showing a manufacturing process of the second substrate 240 prepared for a case of manufacturing the detection device 100 including the direct current removing section 350 shown in FIG. 35.

First, a trench 245 that is a recess is formed by etching in a P type well region 247 in a ground substrate 241 formed of silicon monocrystal. The trench 245 has a bottom surface closed within the P type well region 247 in a thickness direction of the ground substrate 241. Therefore, the trench 245 does not penetrate the ground substrate 241.

Figure 38:
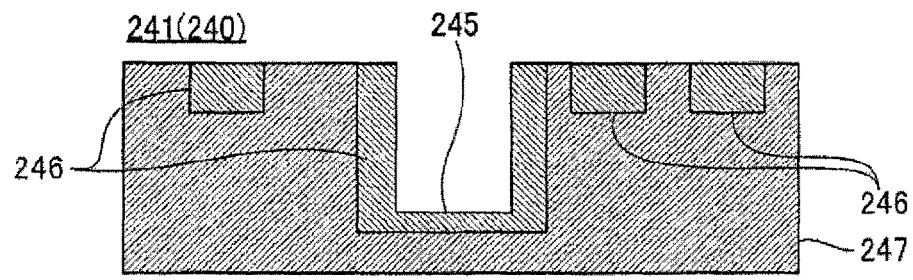
FIG. 38 is a drawing showing a manufacturing process of the second substrate 240.

FIG. 38 is a drawing showing the next manufacturing process of the second substrate 240. Next, a recess is formed in the P type well region 247 of the ground substrate 241, and a plurality of dispersion layers 246 are formed by diffusing the N type impurities within the recess. Here, the dispersion layers 246 formed in the front surface of the ground substrate 241 on the upper side of the drawing form a drain or a source such as the transistor section 243. Also, a dispersion layer formed in the inner surface of the trench 245 forms one end of the capacitor 144.

Figure 39:
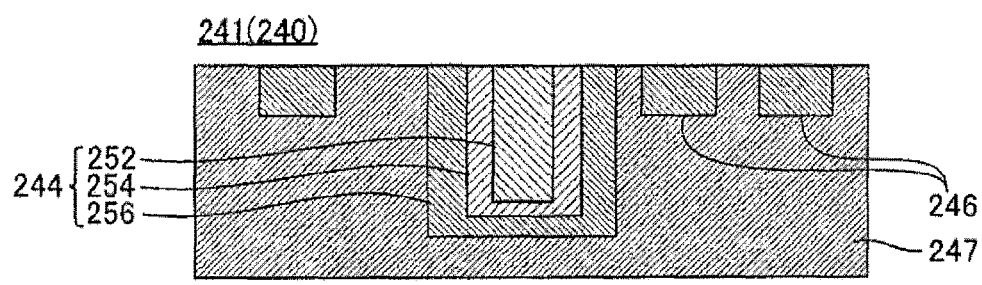
FIG. 39 is a drawing showing a manufacturing process of the second substrate 240.

FIG. 39 is a drawing showing a still next manufacturing process of the second substrate 240. Next, in the inner surface of the trench 245 of the ground substrate 241, the dielectric film 254 such as the oxide film is deposited. Furthermore, in a state where the front surface of the dispersion layer 246 is covered by the dielectric film 254, the inner part of the trench 245 is filled with the conductive via 252 formed by the conductor. In this way, the capacitor 244 buried in the ground substrate 241 is formed in the second substrate 240.

Figure 40:
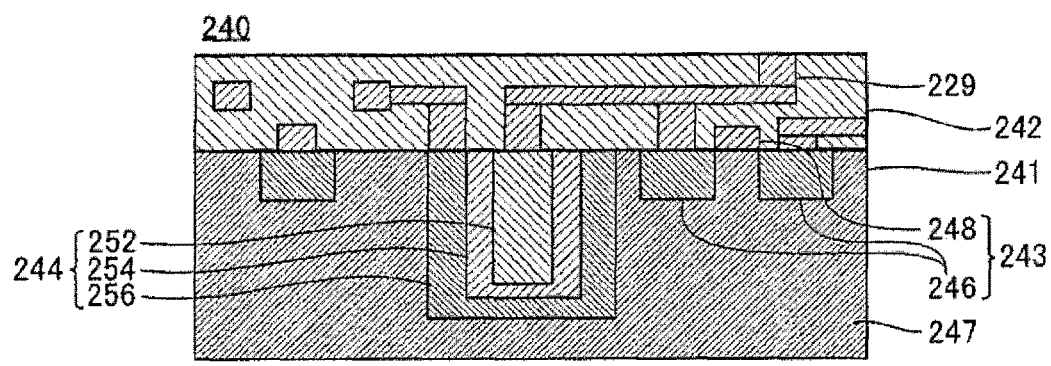
FIG. 40 is a schematic cross-sectional view of the second substrate 240.

FIG. 40 is a drawing showing a still next manufacturing process of the second substrate 240. Next, the laminated circuit section 242 is formed by alternately depositing the conductor layer and the insulated body layer in the front surface, on the upper side of the drawing, of the ground substrate 241 in which the capacitor 244 and the dispersion layer 246 are formed. In the laminated circuit section 242, a gate electrode 248 is also included, the gate electrode 248 and a pair of dispersion layers 246 forming the transistor section 243 together. Also, in the most front surface of the laminated circuit section 242, the connection section 229 is also included, which is in charge of electrical connection in a case of joining to the first substrate 210. In this way, the second substrate 240 is formed.

Figure 41:
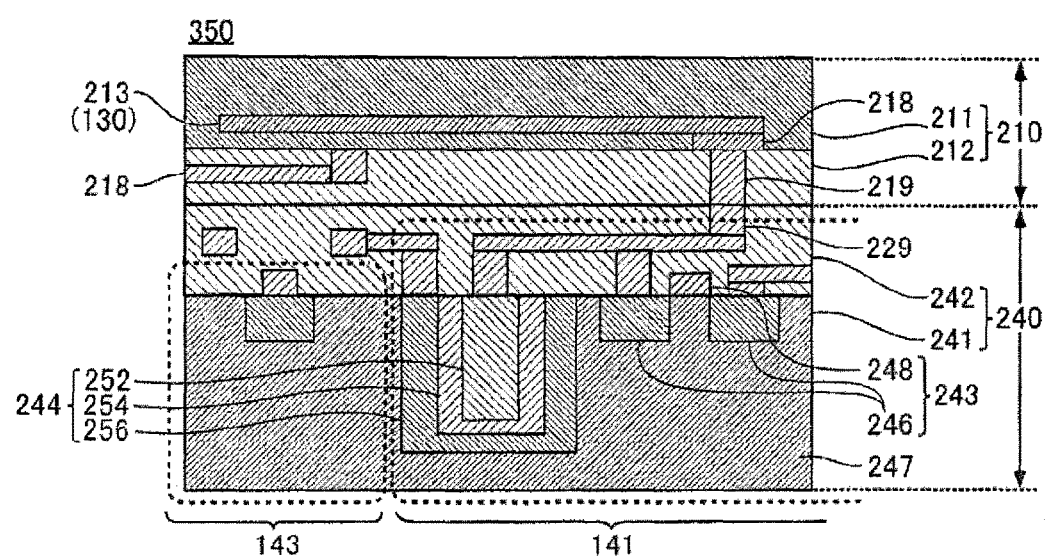
FIG. 41 is a schematic cross-sectional view of the direct current removing section 350.

FIG. 41 is a schematic cross section of the direct current removing section 350 formed by using the above-described second substrate 240 and the first substrate 210 shown in FIG. 13. It should be noted that in FIG. 41, the reference numerals used for showing the elements of layer structures in FIG. 37 to FIG. 40 are shown along with the reference numerals used for showing the elements in FIG. 35.

As illustrated, in a case where the first substrate 210 and the second substrate 240 are laminated, one end of the photoelectric converter 130 is connected to the connection section 229 of the second substrate 220 via the wiring section 218 and the connection section 219. The connection section 229 of the second substrate 240 are respectively connected to one end of the transistor section 243 and to one end of the capacitor 244 via the wiring of the laminated circuit section 242. Accordingly, the filtering section 141 is formed in the second substrate 240.

Also, in the second substrate 240, the output section 143 and the like are formed by the wiring and the elements of other regions of the laminated circuit section 242. In this way, the detection device 100 can be formed by laminating two substrates, that is, the first substrate 210 and the second substrate 240. Here, since only the photoelectric converter 130 is formed in the first substrate 210, the light-receiving sections are formed in high density in the detection device 100. Also, in the second substrate 240, since the filtering section 141 is formed by using the transistor section 243 that operates in the saturated region as the resistor and the capacitor 244 that is buried in the ground substrate 241, the utilization efficiency of the ground substrate 241 in the filtering section 141 is high.

It should be noted that the capacitor 244 formed by using the trench 245 can be used in a case of forming the direct current removing section 140 shown in FIG. 3. Therefore, the detection device 100 including the direct current removing section 140 also can be formed by two substrates, that is, the first substrate 210 in which the photoelectric converter 130 is formed and the second substrate 240 in which the capacitor 244 is formed by the trench.

Figure 42:
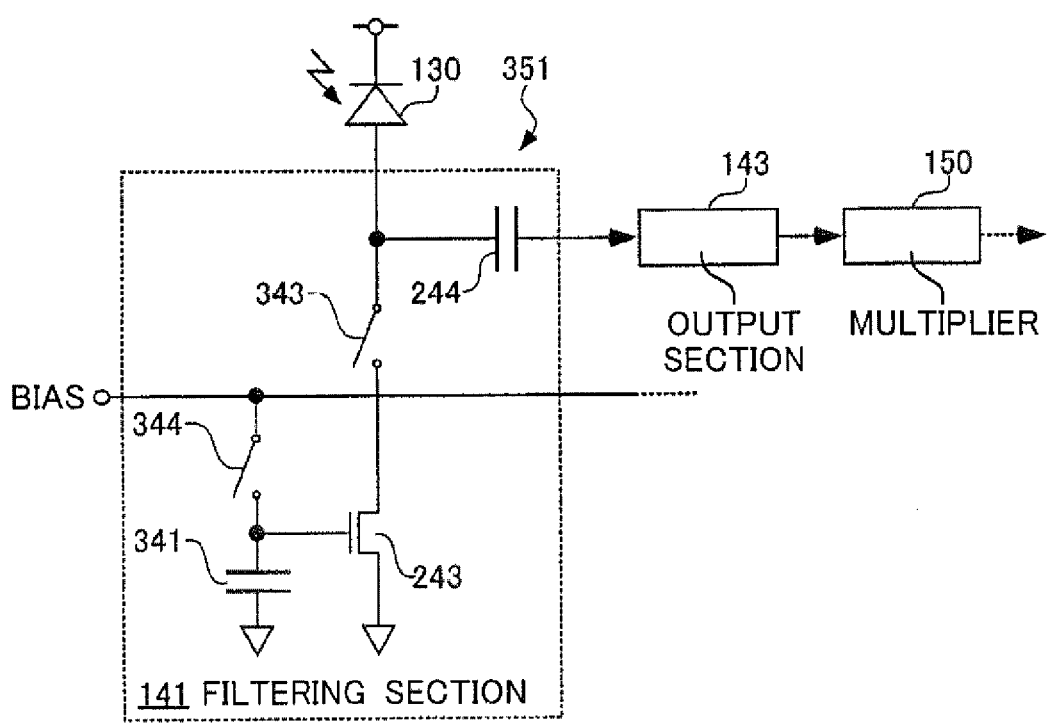
FIG. 42 is a circuit diagram of a direct current removing section 351.

FIG. 42 is a circuit diagram of the direct current removing section 351 having another structure. The direct current removing section 351 has the same structure as that of the direct current removing section 350 shown in FIG. 35, except portions which will be described next. Therefore, the same reference numerals are given to the common elements and the repeated descriptions are omitted.

The direct current removing section 351 is different from the direct current removing section 140 in that the capacitor 341 and the switch element 344 are included which are arranged in the filtering section 141. The capacitor 341 is connected to a control terminal of the transistor section 243 that operates as an active resistor in the saturated region. The switch element 344 is connected to or blocks the bias power source relative to the capacitor 341.

In a case where the switch element 344 connects the bias power source to the capacitor 341, the capacitor 341 is charged and a voltage applied to the control terminal of the transistor section 243 is generated. Even if the switch element 344 blocks the bias power source from the capacitor 341, the capacitor 341 maintains the voltage applied to the control terminal of the transistor section 243. Also, since the bias power source stops to charge the capacitor 341, the power consumption in the direct current removing section 351 can be suppressed.

Figure 43:
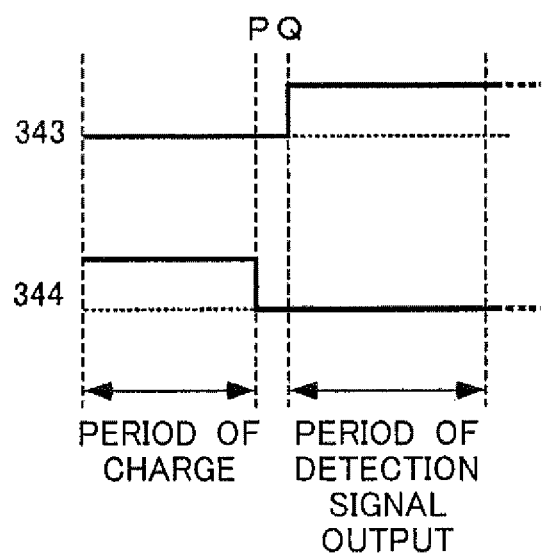
FIG. 43 is a timing chart showing an operation of the direct current removing section 351.

FIG. 43 is a timing chart showing operations of the direct current removing section 351. At the beginning of starting operations of the detection device 100 including the direct current removing section 351, the switch element 342 connected to the photoelectric converter 130 is opened, and the switch element 344 connected to the transistor section 243 and the capacitor 341 is closed. Accordingly, the capacitor 341 is charged by the power supplied from the bias power source. Therefore, a potential difference between both ends of the capacitor 341 is generated.

In the illustrated timing P, first, the switch element 344 is opened. Accordingly, the current from the bias power source to the capacitor 244 is blocked; however, the potential difference between the both ends of the capacitor 341 is maintained. Therefore, the voltage generated by the charged capacitor 341 is applied to the control terminal of the transistor section 243. This state is maintained until the charge amount of the capacitor 341 drops due to an unavoidable leakage current. In this manner, the direct current removing section 351 can maintain the operations of the transistor section 243 in the saturated region without causing a bias current to flow.

Next, in the illustrated timing Q, the switch element 343 is closed, and the photoelectric converter 130 is connected to the transistor section 243. Accordingly, a signal filtered by the high pass filter that is formed by the transistor section 243 and the capacitor 244 is output in the output section 143. It should be noted that for the switch elements 343, 344 in the direct current removing section 351, the transistor and the like which can be repeatedly opened and closed by an electrical control can be used.

Figure 44:
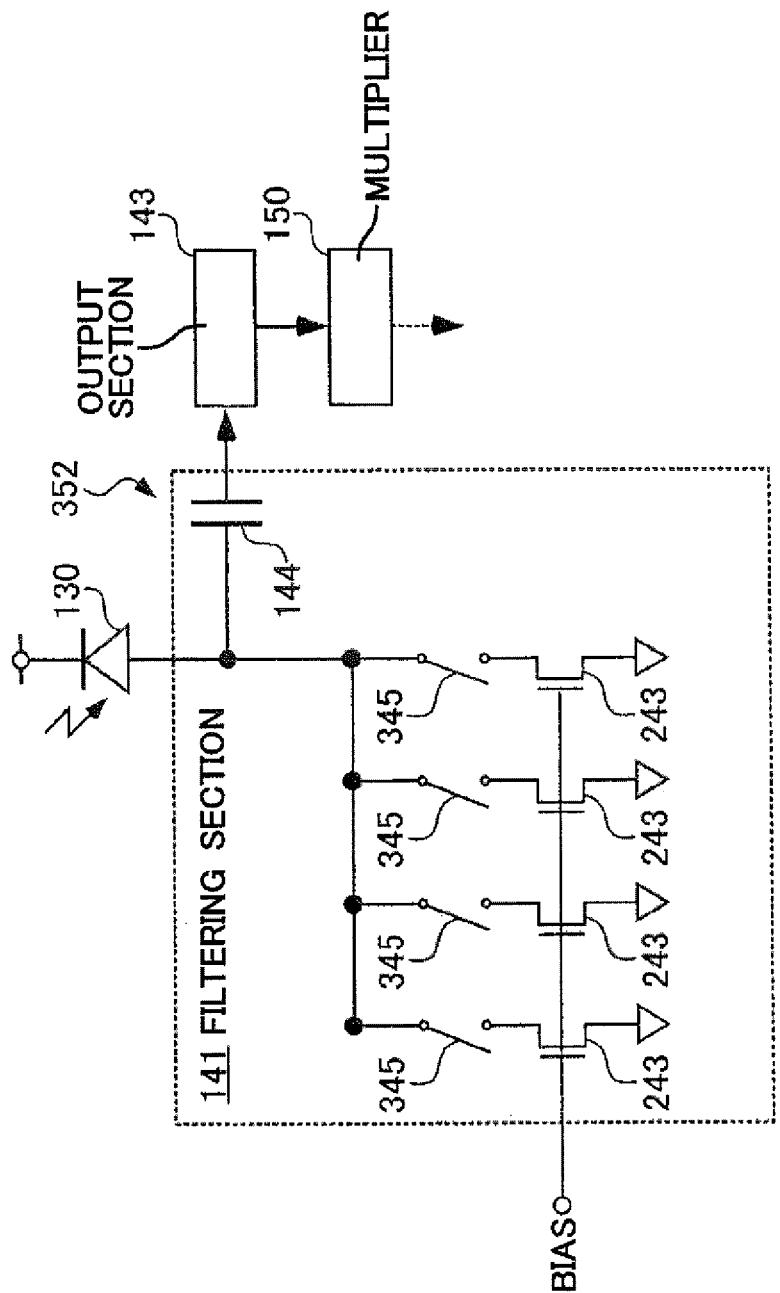
FIG. 44 is a circuit diagram of a direct current removing section 352.

FIG. 44 is a circuit diagram of the direct current removing section 352 having still another structure. The direct current removing section 352 has the same structure as that of the direct current removing section 350 shown in FIG. 35, except the portions which will be described next. Therefore, the same reference numerals are given to the common elements and the repeated descriptions are omitted.

The direct current removing section 352 has a plurality of switch elements 345 and a plurality of transistor sections 243. One end of each of the plurality of transistor sections 243 is individually connected to the capacitor 144 via the switch element 345. The plurality of switch elements 345 are individually opened and closed, and if closed, connect the corresponding transistor section 243 to the capacitor 144.

Therefore, the direct current removing section 352 can change the characteristics of the filtering section 141 by selecting the switch element 345 to connect. Accordingly, variations in the characteristics of the filtering section 141 due to the manufacture tolerance can be electrically adjusted according to the settings of the switch element 345. Also, according to application of the detection device 100, the bandwidth which should be filtered in the filtering section 141 can be changed.

For the switch element 345 in the filtering section 141, a controller such as the transistor can be used for a case where the opening and the closing are electrically controlled from outside. Also, if used for just one-time adjustment such as an adjustment for manufacture error, a single-use element such as a fusing fuse may be used.

It should be noted that although the illustrated filtering section 141 includes four sets of the switch elements 345 and the transistor sections 243, the number of selectable transistor sections 243 is not limited to four, which goes without saying. Also, the characteristics of the plurality of transistor sections 243 may be the same as each other or may be mutually different. For example, the characteristics of the transistor sections 243 may be combined so as to make preferred number series defined according to JIS Z 8601, C 5063 and the like of JIS. Accordingly, the characteristics of the filtering section 141 can be changed in a large range.

Furthermore, in addition to the transistor section 243, the characteristics of the filtering section 141 may be finely adjusted by adding small fixed resistors.

Also, in the illustrated example, although the resistance value that determines the cutoff frequency in the filtering section 141 is changed by changing the connecting transistor section 243, other characteristics, for example, at least one of the Gm value and the capacity value may be set as variable. Furthermore, some characteristics values to which the resistance value is added may be set as adjustable.

Furthermore, in the above-described example, the case of forming the passive element that penetrates the substrate and the case of forming the passive element that does not penetrate the substrate have been described respectively. However, of course, the passive element that penetrates and the passive element that does not penetrate may be mixed, and furthermore, the passive element formed in the front surface of the substrate may be further mixed, which goes without saying.

Also, in the above-described example, the example has been shown where the photoelectric converter 130 and the direct current removing section 140 are formed in the different substrates from each other; however, instead of this, the photoelectric converter 130 and the direct current removing section 140 may be formed in the same substrate. In this case, as described before, the direct current removing section 140 is provided for each pixel or for each group including at least a constant number of pixels.

Also, the example has been shown where the resistor 142 and the capacitor 144 of the filtering section 141 are formed in the same substrate as each other; however, instead of this, the resistor 142 and the capacitor 144 may be individually formed in two different substrates alternately laminated.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100 . . . detection device, 110 . . . detection object, 111 . . . natural light source, 112 . . . natural light, 113 . . . illumination light source, 114 . . . modulated illumination light, 120 . . . reflection light, 122 . . . reference signal, 124 . . . signal, 130 . . . photoelectric converter, 140, 340, 350, 351, 352 . . . direct current removing section, 141 . . . filtering section, 142 . . . resistor, 143 . . . output section, 144, 244, 341 . . . capacitor, 146 . . . operational amplifier, 148 . . . resistor, 150 . . . multiplier, 160 . . . low pass filter, 210, 310 . . . first substrate, 211, 221, 231 . . . substrate, 212, 222, 232, 242 . . . laminated circuit section, 213 . . . light-receiving section, 214 . . . wafer support, 218, 228, 238 . . . wiring section, 219, 229, 239 . . . connection section, 220, 240 . . . second substrate, 223, 233, 243 . . . transistor section, 224, 252 . . . conductive via, 225 . . . resistance via, 226 . . . post, 227 . . . oxide film, 230 . . . third substrate, 241 . . . ground substrate, 245 . . . trench, 246, 256 . . . dispersion layer, 247 . . . P type well region, 248 . . . gate electrode, 250 . . . capacity via, 254 . . . dielectric film, 251 . . . viahole, 342, 343, 344, 345 . . . switch element

What is claimed is:

1. A detection device, comprising:
    a plurality of photoelectric converters to output an electrical signal corresponding to an incident light; and
    a plurality of filter circuits provided corresponding to each of the plurality of photoelectric converters or to each of a plurality of element groups respectively including a predetermined number of the photoelectric converters of the plurality of photoelectric converters, the plurality of filter circuits to attenuate a signal having a predetermined frequency from the electrical signal that is output from the plurality of photoelectric converters, wherein
    the plurality of photoelectric converters are provided in a first substrate,
    the plurality of filter circuits are provided in a second substrate laminated on the first substrate, and
    the second substrate has a resistance circuit including a field effect transistor that operates in a saturated region.

2. The detection device according to claim 1, wherein the resistance circuit includes a control circuit to block a current between a drain and a source of the field effect transistor if the photoelectric converters are not receiving lights.

3. The detection device according to claim 1, wherein the resistance circuit has a capacitor that holds a control voltage applied to a control terminal of the field effect transistor.

4. The detection device according to claim 1, wherein the resistance circuit includes a plurality of field effect transistors that individually perform conduction.

5. The detection device according to claim 4, wherein an electric characteristic changing in the resistance circuit includes at least one of a gm value, a resistance value, and a capacity value.

6. The detection device according to claim 4, wherein the plurality of field effect transistors have the same characteristics as each other.

7. The detection device according to claim 4, wherein the plurality of field effect transistors have different characteristics from each other.

8. The detection device according to claim 1, wherein the resistance circuit has a resistor, and at least a part of the resistor is formed of polysilicon.

9. The detection device according to claim 8, wherein the second substrate has a conductive via that is in charge of electrical connection, the conductive via penetrating the second substrate in a thickness direction, and the resistor has an electric resistance value higher than that of the conductive via.

10. The detection device according to claim 1, wherein each of the plurality of filter circuits has a capacitor, and wherein the capacitor is provided in a recess or a through hole, the recess or the through hole formed in the second substrate.

11. The detection device according to claim 10, wherein the second substrate has a conductive via that is in charge of electrical connection, the conductive via penetrating the second substrate in a thickness direction, and wherein
    the capacitor has an electrical capacity greater than that of the conductive via.

12. The detection device according to claim 10, wherein the capacitor includes:
a pair of electrodes formed coaxially relative to a central axis that penetrates the second substrate, and an annular dielectric sandwiched by the pair of electrodes, the capacitor extending in a thickness direction of the second substrate.

13. The detection device according to claim 10, wherein the capacitor includes an electrode formed in the first substrate and an electrode formed in the second substrate.

14. The detection device according to claim 1, wherein
the second substrate has a plurality of substrates, and
the filter circuits have a resistor and a capacitor, and wherein
the resistor and the capacitor are respectively provided in the different substrates from each other.

15. A detection device, comprising:
a first photoelectric converter, included in a first substrate, to output a first electrical signal corresponding to an incident light including a reflection light from a detection object and a background light that is different from the reflection light;
a second photoelectric converter, included in the first substrate, to output a second electrical signal corresponding to the incident light;
a first filter circuit, included in a second substrate laminated on the first substrate, to reduce, from the first electrical signal output from the first photoelectric converter, a signal of a frequency of the background light;
a second filter circuit to reduce, from the second electrical signal output from the second photoelectric converter, a signal of a frequency or the background light; and
a detection section to detect a distance to the detection object using at least one of a signal output from the first filter circuit and a signal output from the second filter circuit.

16. The detection device according to claim 15, wherein the first filter circuit and the second filter circuit have a resistance component using a field effect transistor that operates in a saturated region.

17. The detection device according to claim 16, wherein the first filter circuit and the second filter circuit have a capacitance component, and
the detection section detects the distance to the detection object using a signal whose frequency is higher than a frequency of the background light output from the first filter circuit and the second filter circuit.

18. An electronic device comprising the detection device according to claim 1.

19. An electronic device comprising the detection device according to claim 15.

20. A method for manufacturing a detection device, comprising:
forming, in a first substrate, a plurality of photoelectric converters that output an electrical signal corresponding to an incident light;
forming, in a second substrate, (i) a plurality of filter circuits corresponding to each of the plurality of photoelectric converters or to each of a plurality of element groups respectively including a predetermined number of the photoelectric converters of the plurality of photoelectric converters, the plurality of filter circuits attenuating, from the electrical signal output from the plurality of photoelectric converters, a signal having a predetermined frequency, and (ii) a resistance circuit including a field effect transistor that operates in a saturated region; and
alternately laminating the first substrate and the second substrate.

21. The method according to claim 20, wherein the forming in the second substrate includes
forming, in a second substrate, a reduction section that reduces, from the electrical signal output from the photoelectric converter, a component corresponding to a background light included in the incident light.

22. A method for manufacturing a detection device, comprising:
forming, in a first substrate, (i) a first photoelectric converter to output a first electrical signal corresponding to an incident light including a reflection light from a detection object and a background light that is different from the reflection light, and (ii) a second photoelectric converter to output a second electrical signal corresponding to the incident light;
forming, in a second substrate, a first filter circuit to reduce, from the first electrical signal output from the first photoelectric converter, a signal of a frequency of the background light;
laminating the second substrate on the first substrate,
forming a second filter circuit to reduce, from the second electrical signal output from the second photoelectric converter, a signal of a frequency of the background light; and
forming a detection section lo detect a distance to the detection object using at least one of a signal output from the first filter circuit and a signal output from the second filter circuit.

23. The method according to claim 22, wherein
the first filter circuit and the second filter circuit have a resistance component using a field effect transistor that operates in a saturated region.

* * * * *